US011245407B2

(12) United States Patent
Petrov et al.

(10) Patent No.: US 11,245,407 B2
(45) Date of Patent: Feb. 8, 2022

(54) SYSTEM AND METHOD FOR LOW JITTER PHASE-LOCK LOOP BASED FREQUENCY SYNTHESIZER

(71) Applicant: HUAWEI TECHNOLOGIES CO., LTD., Guangdong (CN)

(72) Inventors: Dmitry Petrov, Ottawa (CA); Ehud Nir, Sttitsville (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/925,657

(22) Filed: Jul. 10, 2020

(65) Prior Publication Data
US 2022/0014205 A1    Jan. 13, 2022

(51) Int. Cl.
*H03L 7/23* (2006.01)
*H03L 7/093* (2006.01)
*H03L 7/089* (2006.01)
*H03L 7/197* (2006.01)
*H03L 7/081* (2006.01)

(52) U.S. Cl.
CPC ............ *H03L 7/23* (2013.01); *H03L 7/081* (2013.01); *H03L 7/0891* (2013.01); *H03L 7/093* (2013.01); *H03L 7/1974* (2013.01)

(58) Field of Classification Search
CPC ......... H03L 7/081; H03L 7/18; H03L 7/1976; H03L 7/1974; H03L 7/0998
See application file for complete search history.

(56) References Cited

U.S. PATENT DOCUMENTS

| 7,486,145 | B2 * | 2/2009 | Floyd | H03L 7/1974 327/115 |
| 8,988,119 | B2 * | 3/2015 | Danny | H03L 7/081 327/115 |
| 9,608,611 | B1 * | 3/2017 | Hearne | H03K 5/135 |
| 10,511,315 | B1 | 12/2019 | Sarda | |
| 2003/0165209 | A1 | 9/2003 | Chen et al. | |
| 2004/0201913 | A1 | 10/2004 | Sutardja | |

FOREIGN PATENT DOCUMENTS

CN        101640535 A    2/2010

OTHER PUBLICATIONS

Bulzacchelli, John F., et al. "A 10-Gb/s 5-tap DFE/4-tap FFE transceiver in 90-nm CMOS technology." IEEE Journal of Solid-State Circuits 41.12 (2006): 2885-2900. (Year: 2006).*

(Continued)

*Primary Examiner* — Ryan Johnson
(74) *Attorney, Agent, or Firm* — BCF LLP

(57) ABSTRACT

The disclosed systems, structures, and methods are directed to a low jitter phase-lock loop (PLL) based frequency synthesizer, comprising a first frequency divider, a phase frequency detector, a charge pump, a low-pass filter, a voltage control oscillator (VCO), a phase interpolator communicatively coupled in a feedback path between the VCO and the phase frequency detector, wherein the phase interpolator comprises a quadrature generator, an input conditioner, a phase rotator, a current mode logic (CML), and a second frequency divider communicatively coupled in the feedback path between the phase interpolator and the phase frequency detector.

20 Claims, 11 Drawing Sheets

(56) References Cited

OTHER PUBLICATIONS

Toifl, T et al., 0.94ps-rms-Jitter 0,016mm2 2.5 GHz Multi-Phase Generator PLL with 360 degrees Digitally Programmable Phase Shift for 10GB/S Serial Links, ISSCC 2005, Session 22, PLL, DLL, and VCOs, 22.1, 2005.
Koh, K-J et al., 0.13-um CMOS Phase Shifters for X-, Ku-, and K-Band Phased Arrays, IEEE Journal of Solid-State Circuits, vol. 42, No. 11, pp. 2535-2546, Nov. 2007.
Nonis, R. et al., digPLL-Lite: A Low-Complexity, Low-Jitter Fractional-N Digital PLL Architecture, IEEE Journal of Solid-State Circuits, vol. 48, No. 12, pp. 3134-3145, Dec. 2013.
Xiang, X. et al., An 8-12GHz 0.92 degree Phase Error Quadrature Clock Generator Based on Two-Stage Poly Phase Filter with Intermediate Point Compensation, IEEE, 2019.
Shu, G. et al., A Reference-Less Clock and Data Recovery Circuit Using Phase-Rotating Phase-Locked Loop, IEEE Journal of Solid-State Circuits, vol. 49, No. 4, pp. 1036-1047, Apr. 2014.
International Search Report issued in co-pending International application No. PCT/CN2021/104688 dated Oct. 13, 2021.

\* cited by examiner

SYSTEM AND METHOD FOR LOW JITTER PHASE-LOCK LOOP BASED FREQUENCY SYNTHESIZER

CROSS-REFERENCE TO RELATED APPLICATIONS

This is the first application filed for the instantly disclosed technology.

FIELD OF THE INVENTION

The present invention generally relates to the field of communication systems and, in particular, to systems and methods for a low jitter phase-lock loop (PLL) based frequency synthesizer.

BACKGROUND

Phase-lock loops (PLL) are critical electronic circuits commonly employed in several communications systems such as radio, telecommunications, computers, and other electronic applications. As such PLL circuits are configured to provide, for example, local oscillator (LO) signals for transceiver circuits, clock signals for data-recovery circuits, etc. In general, the PLL circuit uses a feedback to maintain an output signal of the PLL circuit in a specific phase relationship with a reference input signal of the PLL circuit, as is well known in the art. When the output frequency of the PLL is equal to the frequency of the reference input signal, the PLL circuit is in a "locked" condition.

Apart from generating the output signals in specific phase relationship with the reference input signal, PLL circuits are also configured to synthesize frequency signals for various applications. In such applications, the PLL circuit acts as a frequency synthesizer and is configured to generate one or more of a plurality of new frequency signals based on harmonics of the reference input signal. Typically, the PLL based frequency synthesizer employs a programmable frequency divider in the PLL circuit feedback loop.

In general, the PLL based frequency synthesizer may be implemented as an "integer-N" synthesizer or "fractional-N" synthesizers, depending on the frequency division ratio N. In particular, with the integer-N synthesizer, the division ratio N is selected such that the output frequency of the integer-N synthesizer is only an integer multiple of the reference frequency. The integer-N synthesizer is advantageous in terms of having a simple design and having fewer spurs in the output spectrum.

On the other hand, a fractional-N synthesizer allows frequencies equal to fractional multiples of the reference frequency to be synthesized. That is, the division ratio N can be a fractional number. The fractional-N synthesizer has several benefits over integer-N synthesizers. Such benefits may include increased loop bandwidth, suppression of the phase noise associated with a voltage control oscillator (VCO) over a larger range. Also, with smaller division factor may result in reduced in-band phase noise.

However, it will be appreciated that the implementing fractional-N synthesizer presents certain challenges to the communication systems. One such challenge is that such the communication systems need to employ hardware, software, and firmware elements that are capable of operating at higher speeds to synthesize high frequency signals.

These challenges may be exacerbated by certain proposed enhancements to the existing communication systems as well as next-generation communication designs. Such enhancements and designs include the deployment of high speed delta-sigma modulator, etc. Such enhancements and designs potentially strain the receiver hardware and software processing resources that are currently implemented.

SUMMARY

The present disclosure generally provides a low jitter phase-lock loop (PLL) based frequency synthesizer. The low jitter PLL based frequency synthesizer may generate frequencies with 1 part per billion (PPB) frequency resolution. In certain embodiments, a low frequency (<=500 MHZ) first order DSM with 29 bits frequency control word resolution may be employed in the low jitter PLL based frequency synthesizer to meet the 1 PPB frequency resolution requirement with ultra-low power and area digital core.

Also, the low jitter PLL based frequency synthesizer may achieve a low phase interpolation integral non-linearity, which may be translated in a low spurious response of the low jitter PLL. In certain embodiments, an analog phase interpolation pre-distortion and input conditioning techniques may be applied to achieve the integral non-linearity of 0.75-1.5 ps. Also, analog modulation to phase modulation in the CML-to-CMOS first stage degenerated feedback inverter further reduces phase interpolation integral non-linearity. It is to be noted that integral non-linearity reduction leads to low phase errors during fractional operations at any fractional ratio of frequency, therefore improving the low jitter PLL spurious response.

Further, the low jitter PLL based frequency synthesizer may reduce Delta-Sigma modulator (DSM) noise during fractional operations while using low order DSM architectures which require low order PLL filtering. In certain embodiments, the low jitter PLL based frequency synthesizer may employ a parallel to serial converter serializing the 500 MHz parallel interface of 8×7 bits phase interpolation control words, coming out of the DSM, into a serial phase interpolation code sequence changing at 4 GHz rate, essentially creating equivalent DSM running at 4 GHz clock rate. Such a high rate of DSM clock noise which is far beyond PLL loop bandwidth corner, allows complete filtering of DSM noise. Hence fractional operations are affected mostly by the phase interpolation integral non-linearity, which has already been made as low as possible.

With this said, an object of the present disclosure is to provide a low jitter PLL based frequency synthesizer, comprising a first frequency divider configured to divide a reference frequency associated with an input signal $V_{in}$ by an factor M, a phase frequency detector configured to generate an error voltage signal, a charge pump configured to generate an error current signal corresponding to the error voltage signal, a low-pass filter configured to filter the error current signal, a voltage control oscillator (VCO), communicatively coupled to the low-pass filter, configured to generate an output signal $V_{VCO\_frac}$ having a fractional frequency, wherein the fractional frequency is $C_{frac}$ times the reference frequency associated with the input signal $V_{in}$, $C_{frac}$ being an integer or a fractional value, a phase interpolator communicatively coupled in a feedback path between the VCO and the phase frequency detector, wherein the phase interpolator comprises, a quadrature generator configured to generate a plurality of phase shifted signals from the output signal $V_{VCO\_frac}$, an input conditioner configured to perform wave shaping of the plurality of phase shifted signals, an input conditioner configured to perform wave shaping of the plurality of phase shifted signals, a phase rotator, wherein the phase rotator is configured to, receive a wave shaped plurality of phase shifted signals, provide positive or negative phase shifts to the wave shaped plurality of phase shifted signals in accordance with a control signal, generate a rotation frequency in accordance with the positive or negative phase shifts provided to the wave shaped plurality of phase shifted signals, provide an updated output signal $V_{VCO\_int}$ having an integer frequency closest to the fractional frequency by removing the rotational frequency from the output signal $V_{VCO\_frac}$ having the fractional frequency, a current mode logic (CML) to complementary metal-oxide-semiconductor (CMOS) converter configured to receive CML differential voltage levels associated with the updated output signal $V_{VCO\_int}$ and convert CML differential voltage levels to CMOS compatible voltage levels, a second frequency divider communicatively coupled in the feedback path between the phase interpolator and the phase frequency detector configured to divide the integer frequency associated with the updated output signal $V_{VCO\_int}$ by a factor $N_a \times N_b$, wherein, $N_a$ and $N_b$ are feedback division ratios associated with the second frequency divider and provides a difference signal $V_{diff}$ to the phase frequency detector.

In accordance with other aspects of the present disclosure, the PLL based frequency synthesizer, wherein the CML to CMOS converter comprises three AC coupled stages.

In accordance with other aspects of the present disclosure, the PLL based frequency synthesizer, wherein the first AC coupled stage is configured to convert the amplitude modulated CML differential voltage levels associated with the updated output signal $V_{VCO\_int}$ to phase modulated CMOS differential voltage levels.

In accordance with other aspects of the present disclosure, the PLL based frequency synthesizer, wherein the first AC coupled stage further comprises a first capacitor, a second capacitor, a first inverter, a second inverter, a first resistive feedback and a second resistive feedback, wherein the first resistive feedback and the second resistive feedback are adjustable.

In accordance with other aspects of the present disclosure, the PLL based frequency synthesizer, wherein the second AC coupled stage is configured to perform correction of the duty cycle associated with the CML differential voltage levels associated with the updated output signal $V_{VCO\_int}$.

In accordance with other aspects of the present disclosure, the PLL based frequency synthesizer, wherein the AC coupled stage further comprises a third capacitor, a fourth capacitor, a third inverter, a fourth inverter, a third resistive feedback and a fourth resistive feedback, wherein the third resistive feedback and the fourth resistive feedback are adjustable.

In accordance with other aspects of the present disclosure, the PLL based frequency synthesizer, wherein the third AC coupled stage is configured to provide amplitude amplification to the output of the second stage of the CML to CMOS converter.

In accordance with other aspects of the present disclosure, the PLL based frequency synthesizer, wherein the quadrature generator is a divider by two based quadrature generator.

In accordance with other aspects of the present disclosure, the PLL based frequency synthesizer, wherein the quadrature generator is an all path quadrature generator.

In accordance with other aspects of the present disclosure, the PLL based frequency synthesizer, wherein the quadrature generator is a poly-phase filter based quadrature generator.

In accordance with other aspects of the present disclosure, the PLL based frequency synthesizer, wherein the quadrature generator is a RC ladder network based quadrature generator.

In accordance with other aspects of the present disclosure, the PLL based frequency synthesizer, wherein the quadrature generator is a LC ladder network based quadrature generator.

In accordance with other aspects of the present disclosure, the PLL based frequency synthesizer, wherein the input conditioner configured to change the wave shape the plurality of phase shifted signals to triangular waves.

In accordance with other aspects of the present disclosure, the PLL based frequency synthesizer, wherein the control signal is generated by a phase interpolator (PI) controller.

In accordance with other aspects of the present disclosure, the PLL based frequency synthesizer, wherein the PI controller further comprises a frequency-to-phase converter configured to receive a frequency control word (FCW) and convert a frequency associated with the associated with the FCW to a phase, a Delta-Sigma modulator (DSM) configured to generate a step signal in accordance with the FCW, a sub-step calculator configured to generate sub-step signals corresponding to the step signal, a parallel to serial converter configured to receive sub-step signals in parallel and convert the parallel sub-step signals into a serial signal representing the control signal.

In accordance with other aspects of the present disclosure, the PLL based frequency synthesizer, further comprising a third frequency divider.

In accordance with other aspects of the present disclosure, the PLL based frequency synthesizer, wherein the third frequency divider is configured to divide the fractional frequency by a first factor $K_1$ and a second factor $K_2$, wherein the second factor $K_2$ is greater than the first factor $K_1$.

In accordance with other aspects of the present disclosure, the PLL based frequency synthesizer, the DSM is further configured to operate on a clock frequency equals to the fractional frequency divided by the first factor $K_1$.

In accordance with other aspects of the present disclosure, the PLL based frequency synthesizer, the parallel to serial converter is further configured to operate on a clock frequency equals to the fractional frequency divided by the first factor $K_2$.

In accordance with other aspects of the present disclosure, the PLL based frequency synthesizer, wherein the rotation frequency is based on a difference between the fractional frequency and the integer frequency.

Another object of the present disclosure is to provide a method for synthesizing fractional frequency comprising dividing, by a first frequency divider, a reference frequency associated with an input signal $V_{in}$ by an factor M, generating, by a phase frequency detector, an error voltage signal, generating, by a charge pump, an error current signal corresponding to the error voltage signal, filtering, by a low-pass filter, the error current signal, generating, by a voltage control oscillator (VCO), an output signal $V_{VCO\_frac}$ having a fractional frequency, wherein the fractional frequency is $C_{frac}$ times the reference frequency associated with the input signal $V_{in}$, $C_{frac}$ being an integer or a fractional value, generating, by a quadrature generator, a plurality of phase shifted signals from the output signal $V_{VCO\_frac}$, performing, by an input conditioner, wave shaping of the plurality of phase shifted signals, receiving, by a phase rotator, wave shaped plurality of phase shifted signals, providing, by the phase rotator, positive or negative phase shifts to the wave shaped plurality of phase shifted signals in accordance with a control signal, generating, by the phase rotator, a rotation frequency in accordance with the positive or negative phase shifts provided to the wave shaped plurality of phase shifted signals, providing, by the phase rotator, an updated output signal $V_{VCO\_int}$ having an integer frequency closest to the fractional frequency by removing the rotational frequency from the output signal $V_{VCO\_frac}$ having the fractional frequency, receiving, by a current mode logic (CML) to complementary metal-oxide-semiconductor (CMOS) converter, CML differential voltage levels associated with the updated output signal $V_{VCO\_int}$, converting, by the CML to CMOS converter, CML differential voltage levels to CMOS compatible voltage levels, dividing, by a second frequency divider, the integer frequency associated with the updated output signal $V_{VCO\_int}$ by a factor $N_a \times N_b$, wherein, $N_a$ and $N_b$ are feedback division ratios associated with the second frequency divider, providing, by the second frequency divider, a difference signal $V_{diff}$ to the phase frequency detector.

BRIEF DESCRIPTION OF THE FIGURES

The features and advantages of the present disclosure will become apparent from the following detailed description, taken in combination with the appended drawings, in which.

Figure 1:
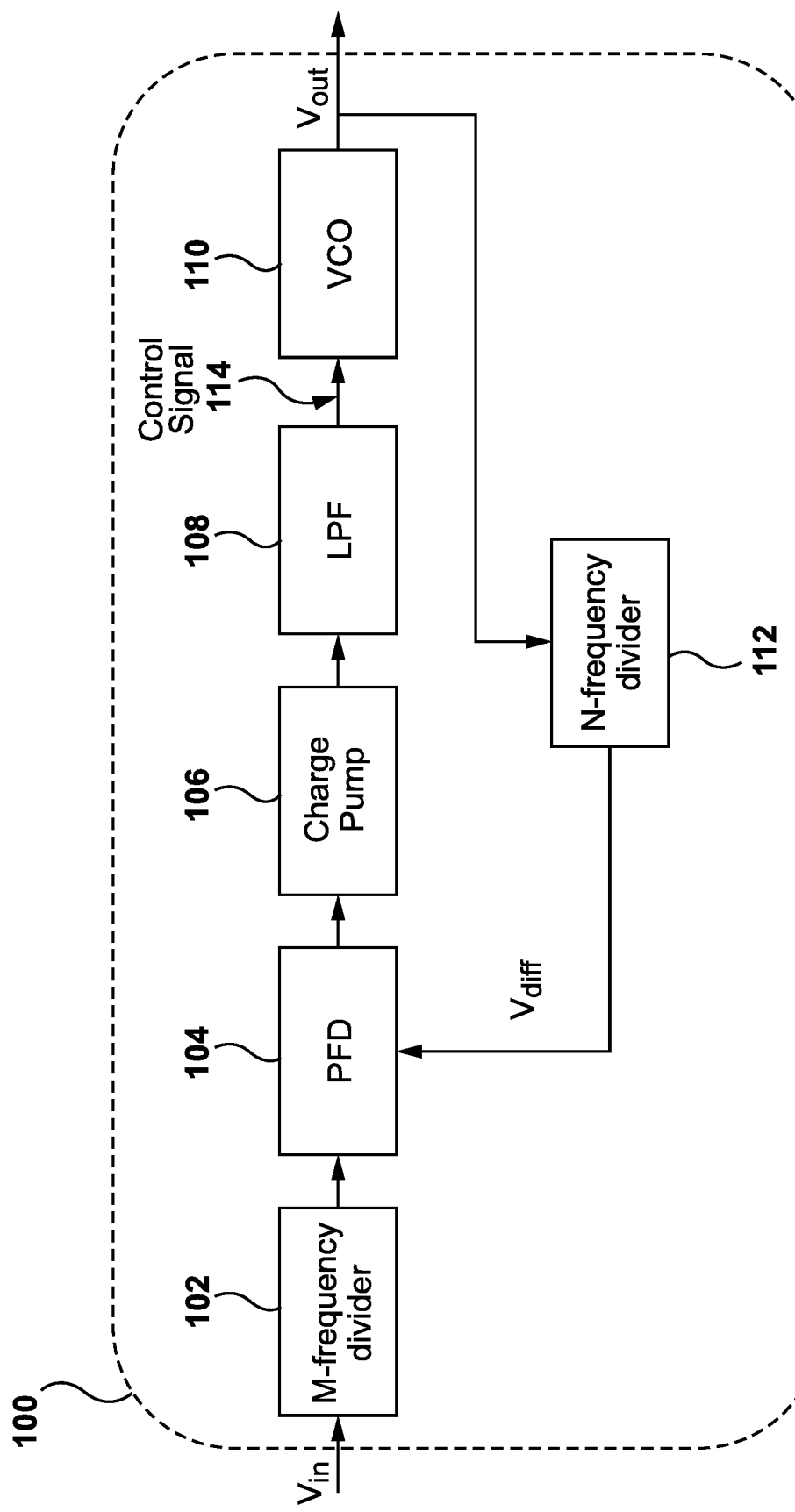
FIG. 1(Prior Art) depicts a high-level functional block diagram of a conventional phase-lock loop (PLL) based frequency synthesizer.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Unless otherwise defined, all technical and scientific terms used herein have the same meaning as commonly understood by one of ordinary skill in the art to which the described embodiments appertain.

FIG. 1 (Prior Art) depicts a high-level functional block diagram of a conventional phase-lock loop (PLL) based fractional frequency synthesizer 100. As shown, the conventional phase-lock loop based frequency synthesizer 100 employs a M-frequency divider 102, a phase frequency detector (PFD) 104, a charge pump 106, a low-pass filter (LPF) 108, a voltage control oscillator (VCO) 110, and a N-frequency divider 112. It is to be noted that other elements may be present but not illustrated for the purposes of tractability and simplicity.

As shown, the M-frequency divider 102 receives a signal $V_{in}$ having an associated frequency $f_{in}$. The M-frequency divider 102 is configured to divide the frequency $f_{in}$ associated with the signal $V_{in}$ by a factor M, where M can be any integer value for e.g. 1, 2, 3 etc. The frequency divided signal $V_{in}$, having a frequency of $f_{in}/M$, is then supplied to the PFD 104. Along with the frequency divided signal $V_{in}$, the PFD 104 also receives a signal $V_{diff}$ (details about the signal $V_{diff}$ will be discussed below) from the N-frequency divider 112.

The PFD 104 is configured to compare the frequency $f_{in}/M$ and its associated phase with the frequency and phase associated with the signal $V_{diff}$. In doing so, the PFD 104 generates an error voltage signal, which represents the phase difference between two signals. The error voltage signal is then supplied to the charge pump 106. As such, the error voltage signal may be an impulse train that is rich in harmonics. The charge pump 106 and the PFD 104 are configured to operate in conjunction to generate an error current signal based on the error voltage signal as generated by the PFD 104.

The error current signals are then forwarded to the LPF 108 for further processing. As such, the LPF 108 is configured to filter the error current signal generated by the charge pump 106 and limits the number of harmonics to a desired number N. The LPF 108 outputs a control signal 114 to control the functionality of the VCO 110.

Typically, the charge pump 106 and LPF 108 operate to amplify and filter the error voltage signal output from the PFD 104 according to a filter transfer function that is selected to achieve desired loop characteristics such as gain, bandwidth, frequency response, etc., in a manner well known in the art.

The control signal 114 is then provided to the VCO 110. The VCO 110 can be implemented in any suitable manner known in the art. The tuning of the VCO 110 can be controlled by voltage level of the control signal 114. The voltage associated with the control signal 114 can incrementally increase or decrease so as to drive frequency $f_{out}$ associated with the output signal $V_{out}$ from the VCO 110 in the direction of $N \times f_{in}/M$. It is to be noted that frequency multiplication of the frequency $f_{in}/M$ by a factor of N can be attained by locking the VCO 110 output frequency to the Nth harmonic of the frequency $f_{in}/M$. In so doing, the conventional phase-lock loop based fractional frequency synthesizer 100 is capable of generating the output signal $V_{out}$ with a frequency $f_{out}$, which is N/M times the frequency $f_{in}$ associated with the $V_{in}$.

The output signal $V_{out}$ is feedback to the PFD 104 via the N-frequency divider 112. The N-frequency divider 112 is configured to divide the frequency $f_{out}$ associated with the output signal $V_{out}$ by the factor N to generate a low frequency difference signal $V_{diff}$ having an associated frequency equals to $f_{out}$/N. It to be noted that $f_{out}$/N equals to $f_{in}$/M when the conventional phase-lock loop based fractional frequency synthesizer 100 achieves the desired "locked" state.

As noted above, the conventional phase-lock loop based fractional frequency synthesizer 100 is capable of providing fractional multiples of input frequencies. However, for the applications operating at a high speed with low clocking jitter requirements, the conventional phase-lock loop based fractional frequency synthesizer 100 requires some additional hardware and software processes operating at high speeds to accommodate low clocking jitter requirements.

Figure 2:
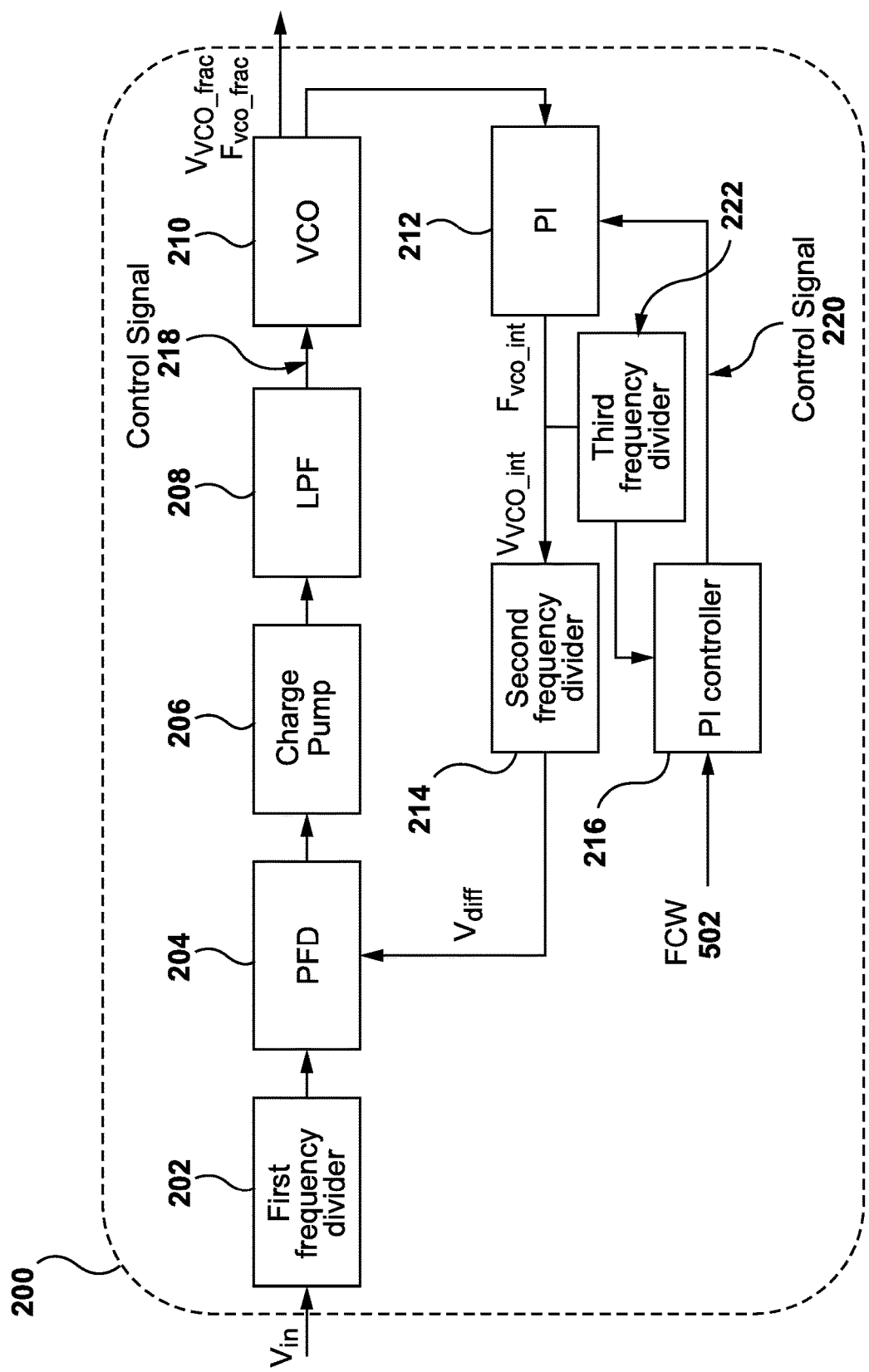
FIG. 2 depicts a high-level functional block diagram of a low jitter PLL based frequency synthesizer, in accordance with various embodiments of the present disclosure.

With this said, FIG. 2 depicts a high-level functional block diagram of a low jitter PLL based frequency synthesizer 200, in accordance with various embodiments of the present disclosure. As shown, the low jitter PLL based frequency synthesizer 200 employs a first frequency divider 202, a phase frequency detector (PFD) 204, a charge pump 206, a low-pass filter (LPF) 208, a voltage control oscillator (VCO) 210, a phase interpolator (PI) 212, a second frequency divider 214, a PI controller 216, and a third frequency divider 222. It is to be noted that other elements may be present but not illustrated for the purposes of tractability and simplicity.

As shown, the first frequency divider 202 receives an input signal $V_{in}$ having an associated reference frequency $f_{ref}$. The first frequency divider 202 may be configured to divide the frequency $f_{ref}$ associated with the input signal $V_{in}$ by a factor M, where M may be any integer value for e.g. 1, 2, 3 etc. The frequency divided input signal $V_{in}$, having a frequency of $f_{ref}$/M, may be supplied to the PFD 204. Along with the frequency divided input signal $V_{in}$, the PFD 204 also receives a difference signal $V_{diff}$ (details about the difference signal $V_{diff}$ will be discussed below) from the second frequency divider 214.

The PFD 204 may be configured to compare the frequency $f_{ref}$/M and its associated phase with the frequency and phase associated with the difference signal $V_{diff}$. In doing so, the PFD 204 generates an error voltage signal, which represents the phase difference between two signals. The error voltage signal may be supplied to the charge pump 206. As such, the error voltage signal may be an impulse train that is rich in harmonics. The charge pump 206 and the PFD 204 are configured to operate in conjunction to generate an error current signal based on the error voltage signal as generated by the PFD 204.

The error current signals are then forwarded to the LPF 208 for further processing. As such, the LPF 208 may be configured to filter the error current signal generated by the charge pump 206 and limits the number of harmonics to a desired number equals to N. In certain embodiments the value of N is approximately equals to $N_a \times N_b$, where $N_a$ and $N_b$ are feedback division ratios associated with the second frequency divider 214. In certain embodiments, $N_a$ may be a smaller integer value (such as 1, 2, 3 or the like) and $N_b$ may be a greater integer value such as, for example, the value of $N_b$ may lies in between 24 to 289. The LPF 208 outputs a control signal 218 to control the functionality of the VCO 210. As such, the LPF 208 may be communicatively coupled to the VCO 210.

In certain embodiments, the charge pump 206 and LPF 208 operate to amplify and filter the error voltage signal output from the PFD 204 according to a filter transfer function that may be selected to achieve desired loop characteristics such as gain, bandwidth, frequency response, etc., in a manner well known in the art.

The control signal 218 may be provided to the VCO 210. The VCO 210 may be implemented in any suitable manner known in the art. The tuning of the VCO 210 may be controlled by voltage level of the control signal 218. The voltage associated with the control signal 218 may incrementally increase or decrease so as to drive a fractional frequency $f_{VCO\_frac}$ associated with an output signal $V_{VCO\_frac}$ from the VCO 210 in the direction of $N \times f_{ref}/M$ such that the fractional frequency $f_{VCO\_frac}$ may be equals to $N \times f_{ref}/M$, N being an integer or a fractional value. It is to be noted that frequency multiplication of the frequency $f_{ref}/M$ by a factor of N may be attained by locking the VCO 210 output frequency to the Nth harmonic of the frequency $f_{ref}/M$.

Further, the value of the ratio N/M may be set in accordance with a fractional multiplication factor $C_{frac}$. In certain embodiments, the reference frequency $f_{ref}$ may be multiplied with the fractional multiplication factor $C_{frac}$ in order to generate a high frequency signal $V_{VCO\_frac}$ having the associated high fractional frequency $f_{VCO\_frac}$. The relationship between the fractional frequency $f_{VCO\_frac}$ and the reference frequency $f_{ref}$ may be expressed as follows:

$$f_{VCO\_frac} = C_{frac} \times f_{ref} \quad (1)$$

It is to be noted that the value of the fractional multiplication factor $C_{frac}$ may be greater than 1. In certain embodiments, the value of the ratio N/M may be selected equals to the fractional multiplication factor $C_{frac}$. By way of an example, the $f_{ref}$ may be equal to 156.25 MHz and the required fractional multiplication factor $C_{frac}$ may be equal to 45.2. In this example, the value of M may be selected as 5 and the value N may be selected as 226.

In the above example, the M-frequency divider 202 may be configured to divide the frequency $f_{ref}$ which may be equal to 156.25 MHz by a factor of 5 and the VCO 210 may be locked to $226^{th}$ harmonic of the frequency $f_{ref}/5$ i.e 31.25 MHz. In so doing, the VCO 210 may provide the output signal $V_{VCO\_frac}$ having the associated fractional frequency of $f_{VCO\_frac}$, which in this example may be equals to 7.0625 GHz. It is to be noted that in certain embodiments, the PI 212 may be configured to operate in order to remove the fractional component from the fractional frequency of $f_{VCO\_frac}$ and providing a nearest integer frequency $f_{VCO\_int}$. In above example the PI 212 may provide 7 GHz while removing remaining fractional component. In this manner, the low jitter PLL based frequency synthesizer 200 may provide a frequency resolution up to 1 part per billion (PPB). That is, for 10 GHz of frequency, the low jitter PLL based frequency synthesizer 200 may provide a resolution of 10 Hz.

Figure 3:
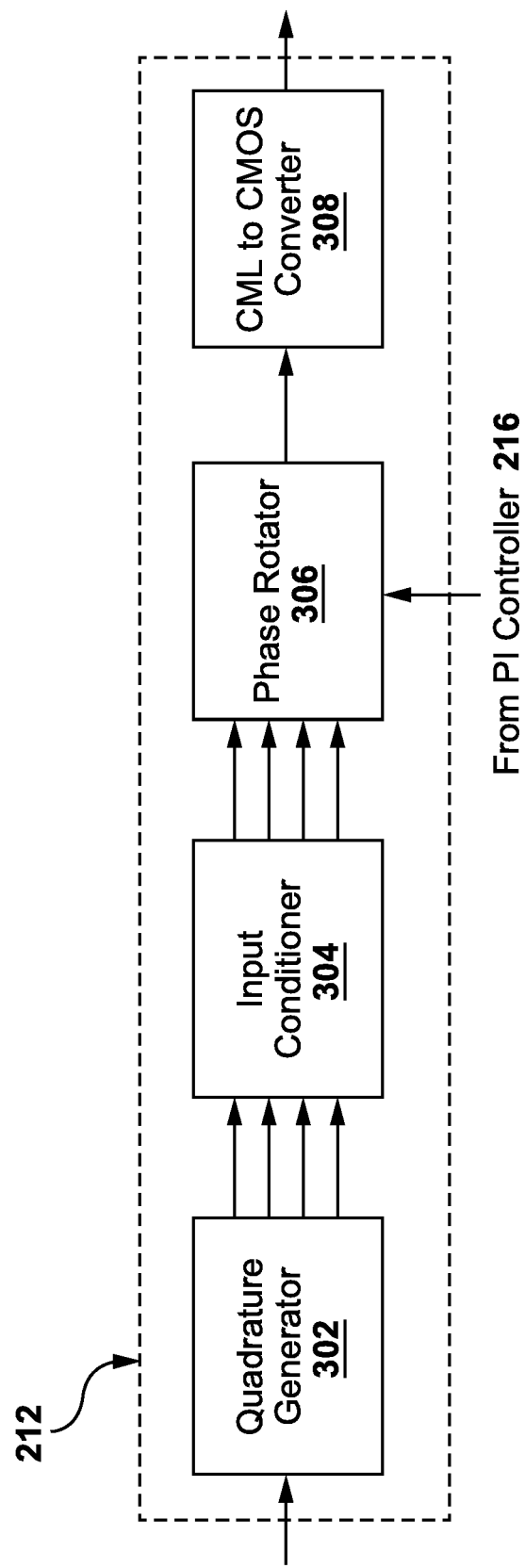
FIG. 3 depicts a high-level functional block diagram of a phase interpolator, in accordance with various embodiments of present disclosure.

With this said, FIG. 3 depicts a high-level functional block diagram of the PI 212 in accordance with various embodiments of present disclosure. The PI 212 may be communicatively coupled to the VCO 210 in a feedback path. As shown, the PI 212 employs a quadrature generator 302, an input conditioner 304, a phase rotator 306 and a current mode logic (CML) to complementary metal-oxide-semiconductor (CMOS) converter 308. It is to be noted that other elements may be present but not illustrated for the purposes of tractability and simplicity.

The quadrature generator 302 may be configured to receive the output signal $V_{VCO\_frac}$ from the VCO 210 and may generate phase shifted signals from the output signal $V_{VCO\_frac}$. In certain embodiments, the quadrature generator 302 may be implemented in any suitable manner such as, for example, divider by two, all path quadrature generator, poly-phase filter, RC ladder network, LC ladder network or the like. In certain embodiments, the quadrature generator 302 may be configured to generate K equidistant phase shifted versions of the output signal $V_{VCO\_frac}$. By way of example, the quadrature generator 302 may generate differential quadrature signals, including differential in-phase signals (I) and (I−) and differential quadrature-phase signals (Q) and (Q−), from the output signal $V_{VCO\_frac}$. The quadrature signals I, Q, I− and Q− may be sinusoidal signals of the same fractional frequency $f_{VCO\_frac}$ as that of the output signal $V_{VCO\_frac}$ but having phases shifted by 0, 90, 180 and 270 degrees, respectively.

The quadrature signals I, Q, I− and Q− may be provided to the input conditioner 304 prior to feeding them to the phase rotator 306. The purpose of introducing the input conditioner 304 prior to the phase rotator 306 is to reduce the effect of integral non-linearity that may be introduced by the phase rotator 306. As such, the non-linearity may introduce jitter at the output of the phase rotator 306 which may degrade the performance of the low jitter PLL based frequency synthesizer 200 operating at high speeds.

In certain embodiments, the input conditioner 304 may be configured to perform wave shaping and convert the shape of the quadrature signals I, Q, I− and Q− to, for example, respective triangular waves. It is to be noted that the wave shaping performed by the input conditioner 304 may be adjustable such as in terms of amplitude and any shape such as triangular shape, saw tooth shape or the like. In certain embodiments, the adjustability of the wave shaping by the input conditioner 304 may be implemented by programmable drive strength CMOS inverters configured to charge independently a programmable capacitance array.

Further, corresponding to various operating frequency ranges associated with the low jitter PLL based frequency synthesizer 200, various optimum adjustments resulting in minimum integral non-linearity may be stored on a computer readable medium (not depicted).

The computer readable medium (not depicted), may includes storage devices and signals, in compressed or uncompressed form. The optimum adjustments may be stored on the computer readable medium (not depicted) in the form of control codes look up table and the low jitter PLL based frequency synthesizer 200 may be configured to access the control codes look up table to perform wave shaping. It will be appreciated that how the computer readable medium is implemented and how the low jitter PLL based frequency synthesizer 200 accesses the control codes look up table should not limit the scope of present disclosure.

Figure 4:
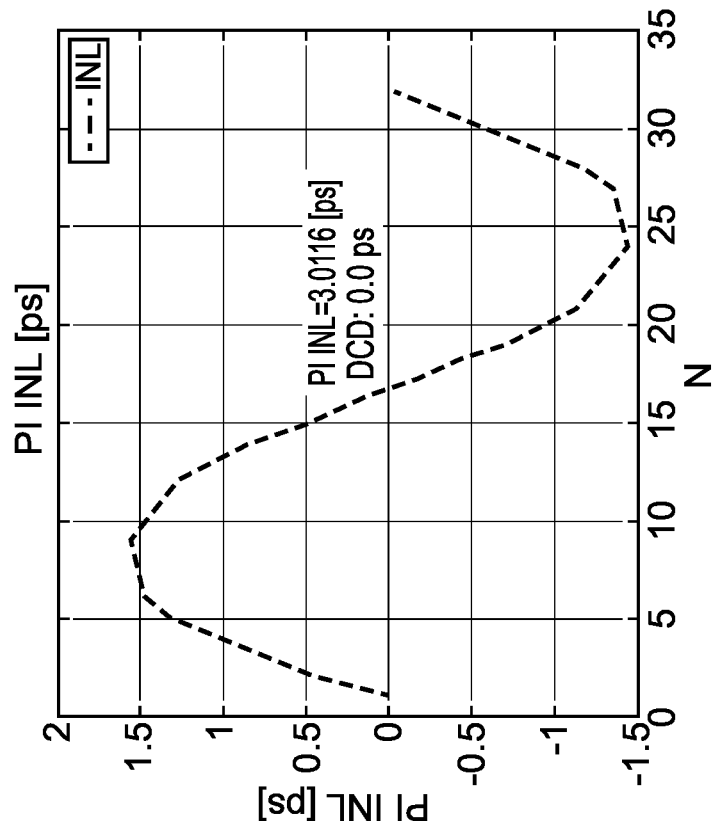
FIG. 4 illustrates simulation results corresponding to integral non-linearity considering an ideal phase rotator when operated with a sinusoidal signal, in accordance with various embodiments of present disclosure.

FIG. 4 illustrates simulation results corresponding to integral non-linearity considering an ideal phase rotator when operated with a sinusoidal signal, in accordance with various embodiments of present disclosure. As shown, corresponding to the sinusoidal signal, the ideal phase rotator exhibits a peak-to-peak integral non-linearity of 3 picosecond.

Figure 5:
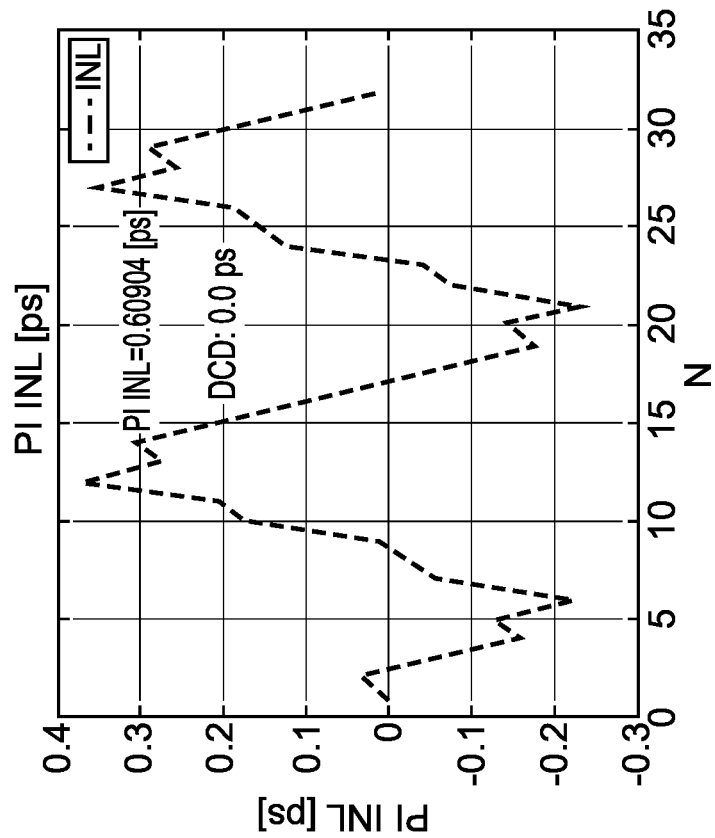
FIG. 5 illustrates simulation results corresponding to integral non-linearity considering an ideal phase rotator when operated with a triangular signal, in accordance with various embodiments of present disclosure.

FIG. 5 illustrates simulation results corresponding to integral non-linearity considering the ideal phase rotator when operated with a triangular signal, in accordance with various embodiments of present disclosure. As shown, corresponding to the triangular signal, the ideal phase rotator exhibits a peak-to-peak integral non-linearity of 0.6 picosecond only. Therefore, conditioning of the quadrature signals I, Q, I− and Q− prior to feeding them to the phase rotator 306 may assist in reducing the integral non-linearity and may eventually results a signal with low jitter. However, in certain embodiments, the integral non-linearity may vary in the range of 0.75-1.5 ps.

Returning to FIG. 3, the input conditioner 304 may provide the wave shaped quadrature signals I, Q, I− and Q− to the phase rotator 306. The phase rotator 306 may incrementally applies a positive or negative phase shift to the quadrature signals I, Q, I− and Q− in response to a control signal 220 output from the PI controller 216 by rotating to different phase states. In so doing, the phase rotator 306 may be configured to generate a rotation frequency $f_{rot}$ in accordance with the positive or negative phase shift to the quadrature signals I, Q, I− and Q− in response to a control signal 220.

In certain embodiment, the phase rotator 306 may be implemented to perform phase interpolation in order to generate the desired output phases by interpolating between the phases of the quadrature signals I, Q, I− and Q−. In one example, the phase rotator 306 may be configured to perform phase shifting by linearly combining I and Q signals in appropriate ratios in the current or voltage domain so as to achieve a desired phase shift resolution. For example, the phase rotator 306 may interpolate between the I and Q input phases to generate four different output phases such as I+Q, I−Q, −I−Q and −I+Q, thereby providing a phase shift resolution of π/2. However, it is to be noted that the implementation of phase rotator 306 is not limited to working on the quadrature signals I, Q, I− and Q− and providing the phase shift resolution of π/2 but the phase rotator 306 may be configured to operate on any number of signals and may also provide any other phase shift resolution.

In certain embodiments, the phase rotator 306 may be implemented as 7-bit current mode logic (CML) phase rotator configured to generate CML differential voltage levels from the quadrature signals I, Q, I− and Q−. Such phase rotator 306 may be capable of applying a phase dithering between $1/128^{th}$ and $1/64^{th}$ of VCO clock period, depending on quadrature generator implementation. As a result, the power associated with the quantization noise injected due to phase dithering may be 42 dB lower than the traditional implementations.

As previously discussed, the frequency of the quadrature signals I, Q, I− and Q− may be equal to the fractional frequency $f_{VCO\_frac}$, the rotation of the phase rotator 306 may remove fractional components from fractional frequency $f_{VCO\_frac}$. Thus the output of the phase rotator 306 is an updated output signal $V_{VCO\_int}$ having integer frequency $f_{VCO\_int}$, therefore following dividers such as the second frequency divider 214 and the PFD 204 may operate as in the integer PLL case. The rotation frequency $f_{rot}$ of the phase rotator 306 may be computed from the integer frequency $f_{VCO\_int}$, which is closest to the fractional frequency $f_{VCO\_frac}$. In certain embodiments the rotation frequency $f_{rot}$ may be computed by dividing the integer frequency $f_{VCO\_int}$ by a suitable factor K, where the factor K is related to a difference between the fractional frequency $f_{VCO\_frac}$ and $f_{VCO\_frac}$. In certain embodiments, the fractional frequency $f_{VCO\_frac}$ from the low jitter PLL based frequency synthesizer 200 may expressed as follows:

$$f_{VCO\_frac} = f_{vco\_int} + \frac{FCW}{64} \times f_{rot} \qquad (2)$$

Where FCW is a frequency code word (discussed below) and 64 represents a number of phase rotator codes per cycle of the integer frequency $f_{VCO}$ int. As an example, for K equals to 32, the FCW may be expressed as:

$$FCW = \left\{ \frac{C_{frac}}{N_a \times N_b / M} - 1 \right\} \times 2048 \quad (3)$$

It is to be noted that the value 64 in the equation (2) and the value of K equals to 32 are merely examples and any other value may be used without departing from the principles presented herein.

As previously mentioned, the rotation of the phase rotator 306 resulting in phase shifting of the quadrature signals I, Q, I− and Q− may be controlled by the control signal 220. However, to attain a desired phase shift, the phase rotator 306 should rotate with certain required rate. Such rate may be defined by a phase rotator code ramp (i.e. average phase rotator code change per unit time), which depends on a rate of code step generation associated with the phase rotator 306, and average code value per step.

Figure 6:
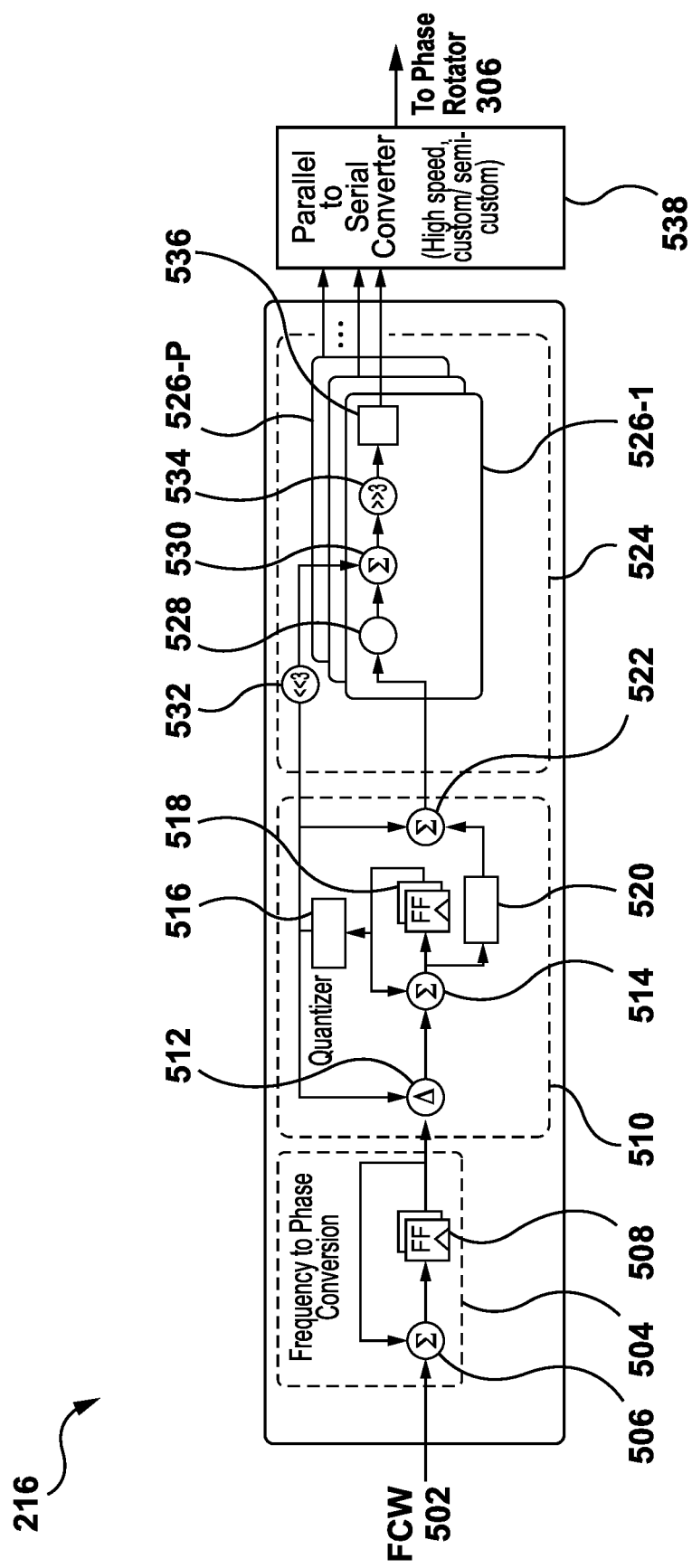
FIG. 6 depicts a high-level functional block diagram of a PI controller, in accordance with various embodiments of present disclosure.

The PI controller 216 may be configured to generate the control signal 220 in order to control the rotation of the phase rotator 306. With this said, FIG. 6 depicts a high-level functional block diagram of the PI controller 216, in accordance with various embodiments of present disclosure. As Shown, the PI controller 216 comprises a frequency-to-phase converter 504, a Delta-Sigma modulator (DSM) 510, a sub-step calculator 524, and a parallel to serial converter 538. It is to be noted that other elements may be present but not illustrated for the purposes of tractability and simplicity.

It will be appreciated that to operate the PI 212 at a high speed, typically a high speed Delta-Sigma modulator operating at some GHz clock frequency would have been required. However, with the implementation of PI controller 216, the DSM 510 may be operated with a lower clock frequency as compared to the typically required clock frequency. As such, in certain embodiments, the third frequency divider 222 may be configured to receive the integer frequency $f_{VCO\_int}$ from the output of the PI 212. The third frequency divider 222 may divide the integer frequency $f_{VCO\_int}$ by a first factor $K_1$ and a second factor $K_2$, wherein the second factor $K_2$ is greater than the first factor $K_1$. The third frequency divider 222 may provide the frequency $f_{VCO\_int}/K_1$ to the DSM 510 and the frequency $f_{VCO\_int}/K_2$ to the parallel to serial converter 538 as respective clock frequencies.

As an example, if the integer frequency $f_{VCO\_int}$ is around 14 GHz, then the third frequency divider 222 may be configured to provide a clock frequency of approximately 500 MHZ to the DSM 510 and a clock frequency of approximately 4 GHz to the parallel to serial converter 538. Details of the implementation of the PI controller 216 will now be discussed.

The frequency-to-phase converter 504 comprises a first adder 506, and a first set of flip-flops 508. The frequency-to-phase converter 504 may be configured to receive a frequency control word (FCW) 502. As such, the FCW 502 may be a digital signal having bits representing a desired increase or decrease in the rotation speed of the phase rotator 306. As an example, the FCW 502 may be of 29 bit, with 7 most significant bits (MSBs) representing the integer part and remaining 22 least significant bits (LSBs) representing fractional part of the FCW 502. The frequency-to-phase converter 504 may further be configured to convert a frequency associated with the FCW 502 to a phase. The FCW 502 may be provided to the first adder 506, where the first adder 506 may be configured to add the FCW 502 and the delayed version of the output of the first adder 506. The first set of flip-flops 508 may be based on delay type flip-flop may be configured to provide a delay in the output of the first adder 506. The output of the frequency-to-phase converter 504 may be represented by θ [n] and a relationship between θ [n] and FCW 502 may be provided by equation (4) as follows:

$$\theta[n] = \theta[n-1] + FCW \quad (4)$$

Where θ[n−1] represents the delayed version of θ [n]. The output of the frequency-to-phase converter 504 may be provided to the DSM 510. The DSM 510 comprises a delta modulator 512, a second adder 514, and a first quantizer 516, a second set of flip-flops 518, a second quantizer 520, and a third adder 522. As such, the delta modulator 512 may be configured to receive the output θ[n] of the frequency-to-phase converter 504 and may be configured to perform delta modulation on the θ[n]. The output of the delta modulator 512 may be represented by equation (5) as follows:

$$\Delta[n] = \theta[n] - \Delta\Sigma[n-1] \quad (5)$$

Where Δ[n] is the output of the delta modulator 512 and the term ΔΣ[n−1] will be discussed below. The output θ[n] of the delta modulator 512 may be supplied to the second adder 514. The second adder 514 may be configured to add the output Δ[n] with the delayed version of the output of the second adder 514. The output of the second adder may be represented by equation (6) as follows:

$$\Sigma[n] = \Sigma[n-1] + \Delta[n] \quad (6)$$

Where Σ[n] is the output of the second adder 514 and Σ[n−1] represents the delayed version of the Σ[n]. The second set of flip-flops 518 may be based on delay type flip-flop and may be configured to provide a delay in the output of the second adder 514. The delayed version Σ[n−1] may be provided to the first quantizer 516. The first quantizer 516 may be configured to perform quantization on the Σ[n−1] and the quantized Σ[n−1] may be represented as ΔΣ[n−1] and, as previously discussed, may be provided to the delta modulator 512 and to the third adder 522. Also, the output Σ[n] of the output of the second adder 514 may be provided to the second quantizer 520. The second quantizer 520 may be configured to perform quantization on the Σ[n] and the quantized Σ[n] may be represented as ΔΣ[n] and may be provided to the third adder 522. In certain embodiments, the first quantizer 516 and the second quantizer 520 may be configured to perform quantization by shifting operation such as:

$$\Delta\Sigma[n] = \lfloor \Sigma[n] \gg 22 \rfloor \quad (7)$$

The operation represented by equation (5) may perform shift right by 22 operation on the output Σ[n] of the output of the second adder 514 to generate ΔΣ[n]. The output of the DSM 510 may be represented by equation (8) as follows:

$$\Delta S[n] = \Delta\Sigma[n] - \Delta\Sigma[n-1] \quad (8)$$

Where ΔS[n] represents a large step signal corresponding to the input FCW 502. The output ΔS[n] of the DSM 510 may be provided to the sub-step calculator 524. The sub-step calculator 524 comprises a plurality of trimmers 526-1, 526-2 . . . 526-P and a first bit shifter 532. Each one of the plurality of trimmers 526-1, 526-2 . . . 526-P such as the trimmer 526-1 comprises a multiplier 528, a fourth adder 530, a second bit shifter 534, and optionally a binary-to-grey code converter 536. The trimmer 526-1 may be configured to receive the output ΔS[n] of the DSM 510 and may provide it to the multiplier 528. The multiplier 528 may be configured to multiply ΔS[n] with a factor "i". The factor i may vary from 1 to P and is different for each of the plurality of trimmers 526-1, 526-2 . . . 526-P. For example, the value i may be equal to 1 for the trimmer 526-1 and 2 for the trimmer 526-2 and so on.

The multiplier 528 may provide i×ΔS[n] to the fourth adder 530. Also, the output ΔΣ[n−1] from the first quantizer 516 may be provided to the first bit shifter 532. The first bit shifter 532 may be configured to perform shift left operation on the ΔΣ[n−1]. In certain embodiments, the ΔΣ[n−1] may be shifted left by 3. The shifted ΔΣ[n−1] along with the i×ΔS[n] may be added together by the fourth adder 530. The output of the fourth adder 530 may be provided to the second bit shifter 534. The second bit shifter 534 may be configured to perform shift right operation on the output of the fourth adder 530. In certain embodiments, the output of the fourth adder 530 may be shifted right by 3. The output of the second bit shifter 534 may be represented as:

$$\text{Trim}_i[n] = \lfloor (\Delta\Sigma[n-1] \ll 3 + i \times (\Delta\Sigma[n] - \Delta\Sigma[n-1])) \gg 3 \rfloor \quad (9)$$

In certain embodiments, the output $\text{Trim}_i[n]$ of the second bit shifter 534 may be proved to the binary-to-grey code converter 536 for converting the binary code associated with the output $\text{Trim}_i[n]$ to an associated grey code. It is to be noted that similar to the trimmer 526-1 the remaining plurality of trimmers 526-2 . . . 526-P may be configured to produce P different sub-step signals from the large step signal output ΔS[n] of the DSM 510 corresponding to P different values of i.

As an example, the sub-step calculator 524 may provide, in parallel, 8 sub-step signals to the parallel to serial converter 538. The parallel to serial converter 538 may be configured to convert 8 parallel sub-step signals to a serial signal representing the phase rotator code ramp. In certain embodiments, the operating clock frequency of the parallel to serial converter 538 may be several times as compared to the operating of the DSM 522. For instance, if the DSM 522 is operating at around 500 MHz then the parallel to serial converter 538 may be operated at around 4 GHz. As such, operating the parallel to serial converter 538 at 4 GHz may be equivalent to operating the DSM 522 at 4 GHz without actually operating the DSM 522 at such a high speed.

The phase rotator code ramp generated at high speed may be provided to the phase rotator 306 as control signal 220. The control signal 220 controls the rotation of the phase rotator 306 such that the phase rotator 306 provides the rotation frequency $f_{rot}$ and eventually the phase rotator 306 may be configured to provide an updated output signal $V_{VCO\_int}$ having the integer frequency integer frequency $f_{VCO\_int}$.

Figures 7, 8:
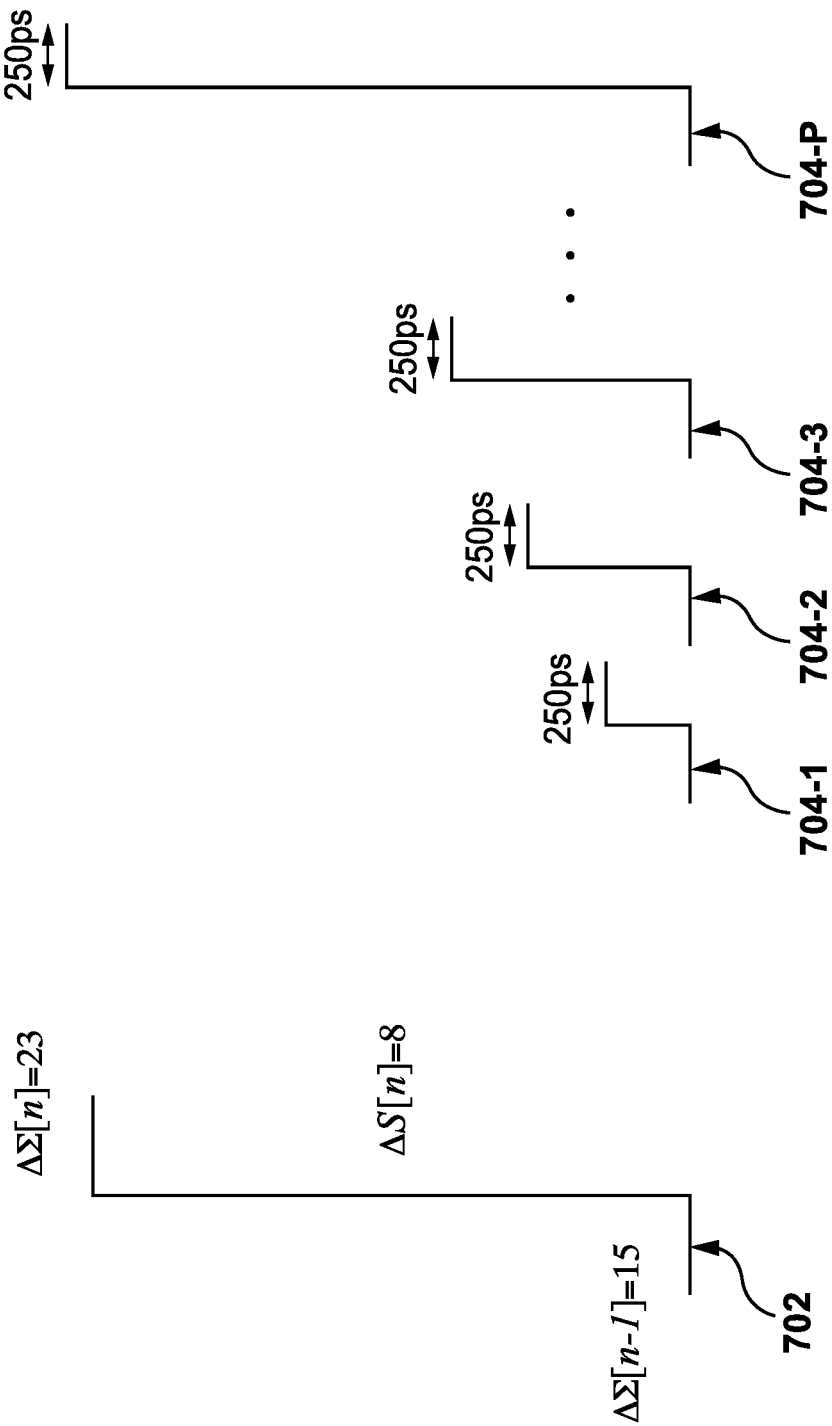
FIGS. 7-10 illustrate representative examples of the output of a Delta-Sigma modulator (DSM), output of a sub-step calculator, output of a serial to parallel converter and a simulation example of the phase rotator code ramp respectively, in accordance with various embodiments of the present disclosure.

FIGS. 7-10 illustrate representative examples of the output of the DSM 510, output of the sub-step calculator 524, output of the parallel to serial converter 538 and a simulation example of the phase rotator code ramp respectively, in accordance with various embodiments of the present disclose. As shown, FIG. 7 illustrates the output 702 of the DSM 510 corresponding to FCW 502 equals to 7.751231 represented in 29 bit binary word as 0000111.1100000001010000101100 with 7 MSBs representing the integer part of the FCW 502 and remaining 22 LSBs representing the fractional part of the FCW 502. As an example, ΔΣ[n]=23, ΔΣ[n−1]=15, and the resulting step size of ΔS[n]=8.

FIG. 8 illustrates the outputs of the plurality of trimmers 526-1, 526-2 . . . 526-P. As shown, 704-1 represents the output of the trimmer 526-1, 704-2 represents the output of the trimmer 526-2, 704-3 represents the output of the trimmer 526-3 and so on. It is to be noted that in certain embodiments, the output of the trimmer 526-P represented as 704-P may be equivalent to the output 702 of the DSM 522. All of these outputs 704-1, 704-2, . . . 704-P may be forwarded in parallel to the parallel to serial converter 538.

Figure 9:
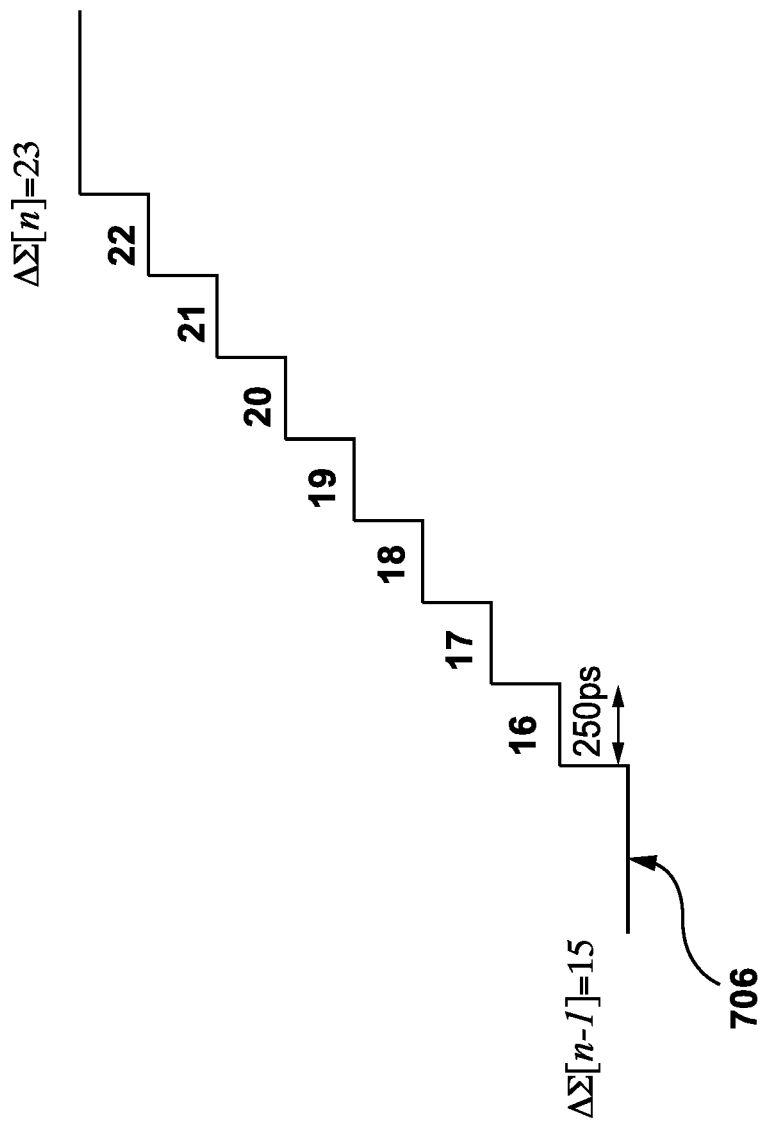

FIG. 9 illustrates the output 706 of the parallel to serial converter 538. As shown, the output of the parallel to serial converter 538 has 8 steps with each step having duration of 250 ps. However, the overall height of 8 steps may be equals to ΔS[n]. The output 706 may act as the control signal 220 having 8 steps and each step having duration of 250 ps, the phase rotator 306 may increment or decrement a phase step by approximately by FCW/8 such as, 7.751231/8 in case of above example.

Figure 10:
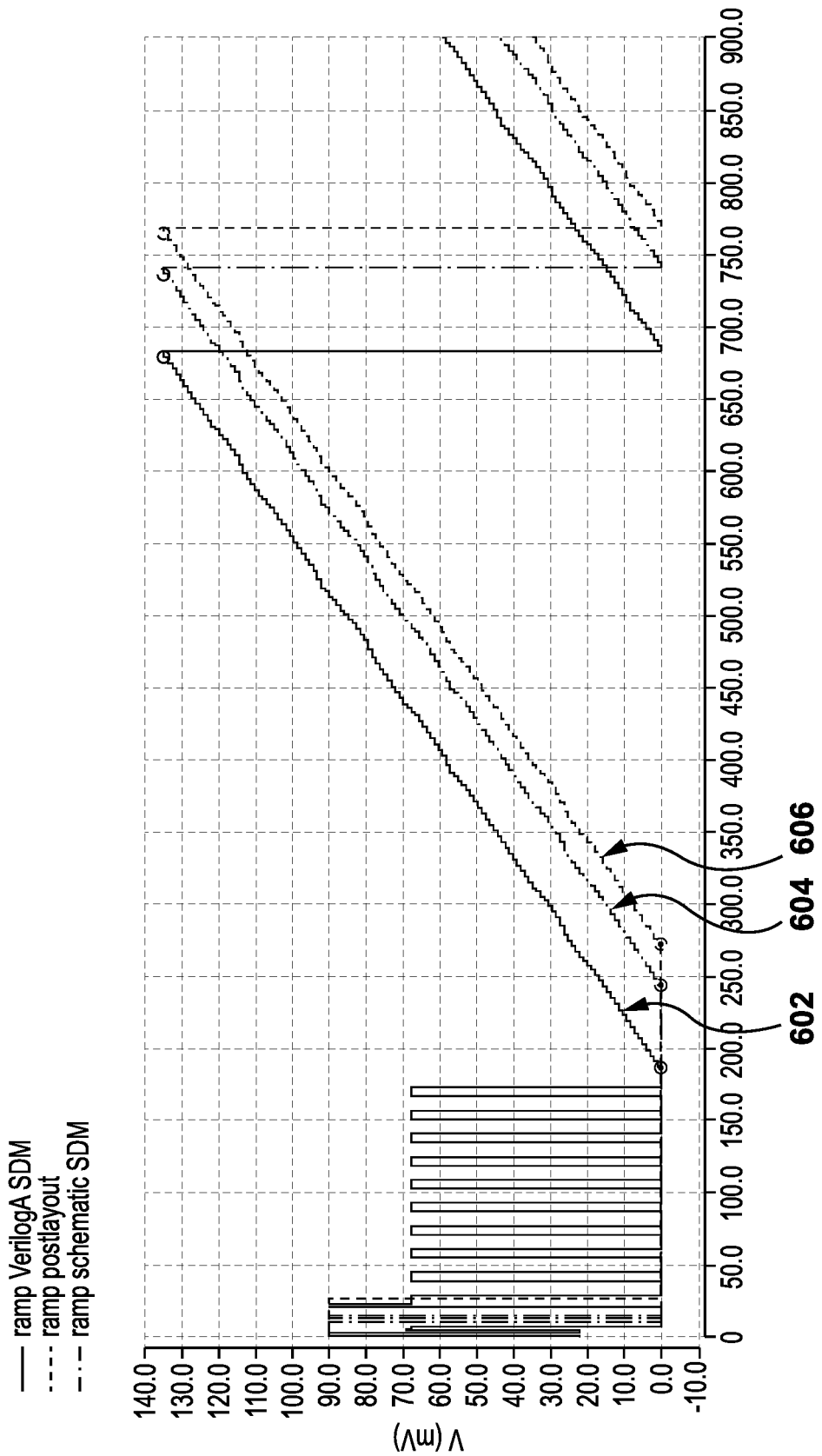

FIG. 10 illustrates the simulation example of various phase rotator code ramps in accordance with various embodiments of the present disclosure. As shown, the x-axis represents the time in nanosecond and y-axis represents voltage in millivolt where each millivolt corresponds to output phase of the PI 212 advance in [ps]. A phase rotator code ramp 602 has a slope of 274.1386 kV/s with change in voltage equals to 134.878 my and change in time equals to 492.0082 ns. A phase rotator code ramp 604, and a phase rotator code ramp 606 represent post-layout simulations of 602 proving circuit immunity to layout imperfections.

In certain embodiments, the low jitter PLL based frequency synthesizer 200 may provide a fine tuning of the fractional frequency $f_{VCO\_frac}$ and a coarse tuning of the integer frequency $f_{VCO\_int}$. In certain embodiment, the low jitter PLL based frequency synthesizer 200 provides the coarse tuning of the integer frequency $f_{VCO\_int}$ by adjusting a divider ratio of the second frequency divider 214 and provides the fine tuning of the fractional frequency $f_{VCO\_frac}$ by controlling the rotation of the phase rotator 306.

Returning to FIG. 3, the phase rotator 306 continuously shifts the phase of the fractional frequency $f_{VCO\_frac}$ by generating the rotation frequency $f_{rot}$. The continuous phase rotation speed change may cause a fine frequency shift in the rotation frequency $f_{rot}$ relative to the fractional frequency $f_{VCO\_frac}$. The fine frequency shift is ultimately reflected as the integer frequency $f_{VCO\_int}$ seen by the feedback properties of the low jitter PLL based frequency synthesizer 200. Accordingly, an increase or decrease in the rotation speed of the phase rotator 306 may adjust the frequency shift of the rotation frequency $f_{rot}$, causing a corresponding frequency shift in the fractional frequency $f_{VCO\_frac}$, since frequency is the derivative of its phase.

Figure 11:
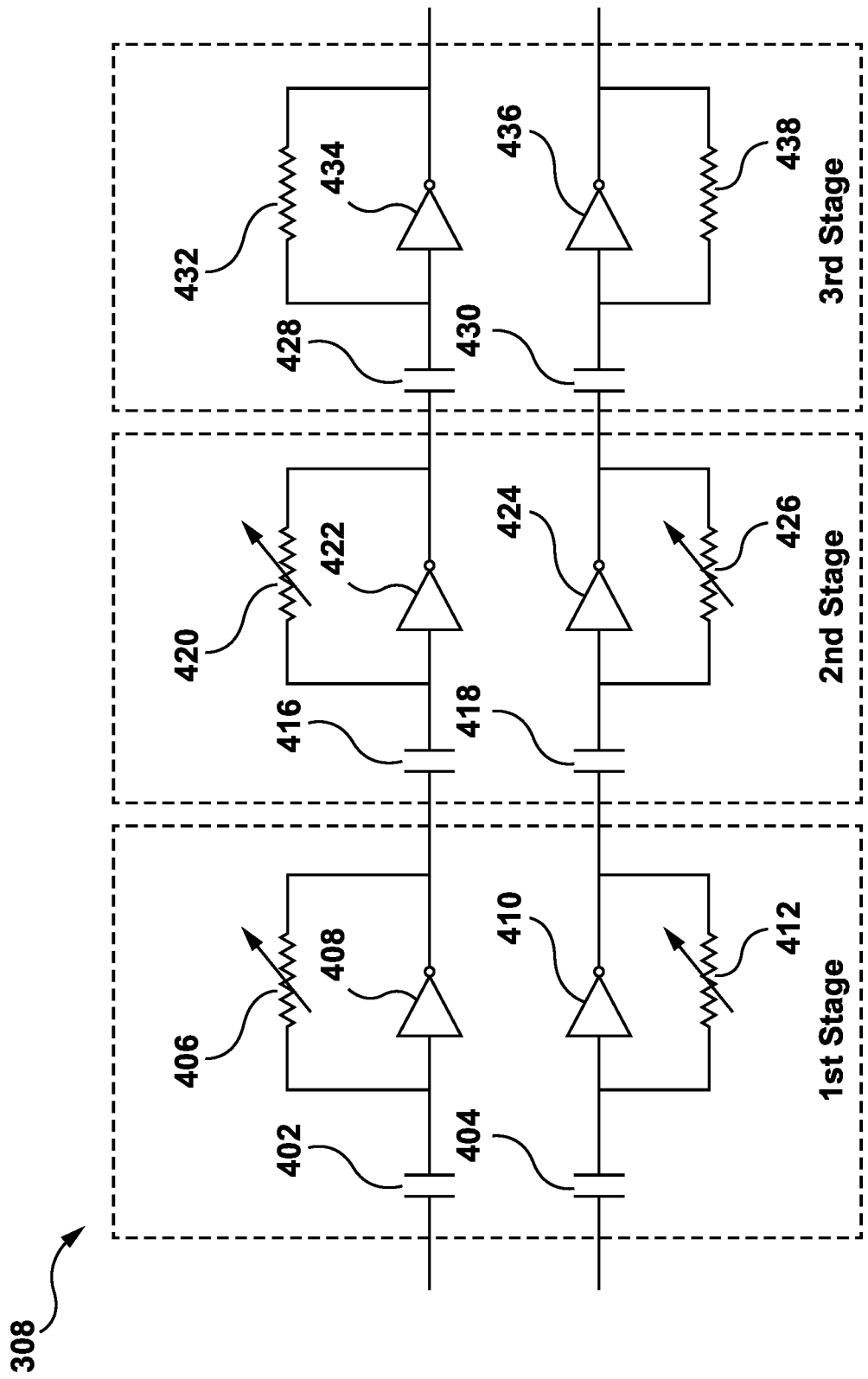
FIG. 11 depicts a high-level functional block diagram of a CML to CMOS converter, in accordance with various aspects of the present disclosure.

In certain embodiments, the output of the phase rotator 306 may be provided to the CML to CMOS converter 308 for further processing. It is to be noted that the quadrature signals I, Q, I− and Q− previously discussed may have different differential voltage ranges with respect to logic high and logic low voltage levels than CMOS technologies. Accordingly, the use of both CML and CMOS technologies in a single integrated circuit requires a conversion of CML differential voltage levels to CMOS compatible voltage level or vice versa. For example, it is well known in the art that a typical CML circuit operates with a differential swing of two to three hundred millivolts. In contrast, a typical CMOS circuit operates according to a single ended voltage within a specified voltage range. For example, with a power supply voltage of 3.0 volts, a voltage of 2.5 V to 3.0 V represents a logic high voltage level and a voltage of 0 V to 0.5 V represents a logic low voltage level. Also, the combination of CML and CMOS circuitry in a single integrated circuit requires a differential to single-ended conversion and a level conversion With this said, FIG. 11 depicts a high-level functional block diagram of the CML to CMOS converter 308, in accordance with various aspects of the present disclosure. The CML to CMOS converter 308 may be configured to receive CML differential voltage levels associated with the updated output signal $V_{VCO\_int}$ from the phase rotator 306 and convert the CML differential voltage levels associated with the updated output signal $V_{VCO\_int}$ to CMOS compatible voltage levels.

As shown, the CML to CMOS converter 308 may be implemented as three AC coupled stages. The first stage of the CML to CMOS converter 308 comprises a first capacitor 402, a second capacitor 404, a first inverter 408, a second inverter 410, a first resistive feedback 406 and a second resistive feedback 412. The first capacitor 402 may be communicatively coupled to the first inverter 408 and to the output of the phase rotator 306. The first resistive feedback 406 may be communicatively coupled between output and input of the first inverter 408. Similarly, the second capacitor 404 may be communicatively coupled to the second inverter 410 and to the output of the phase rotator 306. The second resistive feedback 412 may be communicatively coupled between output and input of the second inverter 408.

The Second stage of the CML to CMOS converter 308 comprises a third capacitor 416, a fourth capacitor 418, a third inverter 422, a fourth inverter 424, a third resistive feedback 420 and a fourth resistive feedback 426. The third capacitor 416 may be communicatively coupled to the third inverter 422 and to the output of the first inverter 408. The third resistive feedback 420 may be communicatively coupled between output and input of the third inverter 422. Similarly, the fourth capacitor 416 may be communicatively coupled to the fourth inverter 424 and to the output of the second inverter 410. The fourth resistive feedback 426 may be communicatively coupled between output and input of the fourth inverter 424.

The third stage of the CML to CMOS converter 308 comprises a fifth capacitor 428, a sixth capacitor 430, a fifth inverter 434, a sixth inverter 436, a fifth resistive feedback 432 and a sixth resistive feedback 438. The fifth capacitor 428 may be communicatively coupled to the fifth inverter 434 and to the output of the third inverter 422. The fifth resistive feedback 432 may be communicatively coupled between output and input of the fifth inverter 434. Similarly, the sixth capacitor 430 may be communicatively coupled to the sixth inverter 436 and to the output of the fourth inverter 424. The sixth resistive feedback 438 may be communicatively coupled between output and input of the sixth inverter 436.

In certain embodiments, the CML to CMOS converter 308 may be configured to receive CML differential voltage levels from the phase rotator 306. As such, the CML differential voltage levels may be amplitude modulated. The first stage of the CML to CMOS converter 308 may be configured to convert the amplitude modulated CML differential voltage levels to phase modulated CMOS differential voltage levels. It is to be noted that the conversion of amplitude modulated CML differential voltage levels to phase modulated CMOS differential voltage levels may further reduce the effect of integral non-linearity and phase errors that may be introduced by the phase rotator 306. Also, the first stage of the CML to CMOS converter 308 may be severely degenerated by the first resistive feedback 406 and the second resistive feedback 412 and the first resistive feedback 406 and the second resistive feedback 412 may be adjustable to achieve a lower value of the integral non-linearity.

In certain embodiments, the second stage of the CML to CMOS converter 308 may be configured to perform correction of the duty cycle associated with the CML differential voltage levels from the phase rotator 306. Also, the second stage of the CML to CMOS converter 308 may be severely degenerated by the third resistive feedback 420 and the fourth resistive feedback 426 and the third resistive feedback 420 and the fourth resistive feedback 426 may be adjustable to perform the correction of the duty cycle. However, it is to be noted that in certain embodiments, the values of the third resistive feedback 420 and the fourth resistive feedback 426 may be greater than the values of the first resistive feedback 406 and the second resistive feedback 412.

In certain embodiments, the third stage of the CML to CMOS converter 308 may be configured to provide amplitude amplification to the output of the second stage of the CML to CMOS converter 308. The fifth resistive feedback 432 and the sixth resistive feedback 438 may or may not be adjustable. However, the values of the fifth resistive feedback 432 and the sixth resistive feedback 438 may be selected in a manner such that the amplitude of the output of the CML to CMOS converter 308 is high enough as required. In certain embodiments, the output of the CML to CMOS converter 308 may be a square wave signal. As an example, the values of the fifth resistive feedback 432 and the sixth resistive feedback 438 may be selected to provide a voltage of 2.5 V to 3.0 V corresponding to the logic high voltage level and a voltage of 0 V to 0.5 V corresponding to the logic low voltage level.

It will be appreciated that by implementing the CML to CMOS converter 308 in the specified manner, the integral non-linearity at the output of the CML to CMOS converter 308 may be reduced up to two times as compared to the integral non-linearity at the output of the phase rotator 306.

Returning to FIG. 2, the output of the CML to CMOS converter 308 may be provided to the second frequency divider 214. The second frequency divider may be communicatively coupled in the feedback path between the PI 212 and the PFD 204. As previously discussed, the fine frequency tuning of the fractional frequency $f_{VCO\_frac}$ may be provided by controlling the phase rotator 306. Whereas, the coarse frequency tuning of the integer frequency $f_{VCO\_int}$ may be provided by the second frequency divider 214.

More specifically, the output of the CML to CMOS converter 308 may be feedback to the PFD 204 via the second frequency divider 214. The second frequency divider 214 may be configured to divide the integer frequency $f_{VCO\_int}$ associated with the updated output signal $V_{VCO\_int}$ by the factor $N_a \times N_b$ to generate a low frequency difference signal $V_{diff}$ having an associated frequency equals to $f_{VCO\_int}/N_a \times N_b$. The second frequency divider 214 may provide the difference signal $V_{diff}$ to the PFD 204. It to be noted that the frequency $f_{VCO\_int}/N_a \times N_b$ approximately equals to $f_{in}/M$ when the low jitter PLL based frequency synthesizer 200 achieves the desired "locked" state.

Apart from the above discussed functionalities of the PI controller 216 such as operating the DSM 510 at such a low speed yet being able to provide a high speed of rotation of the phase rotator 306, the implementation of the PI controller 216 may have several other benefits to the low jitter PLL based frequency synthesizer 200. Such benefits include reducing the effect of quantization noise that may have been introduced by the DSM 510.

Typically, Delta-Sigma modulators are configured to push quantization noise into high frequencies. It will be appreciated that the DSM 510 may be configured to push the associated quantization noise into high frequencies above the cut-off frequency of the LPF 208. As such, the quantization noise may be filtered by the LPF 208 without adding any additional hardware or software components.

Figure 12:
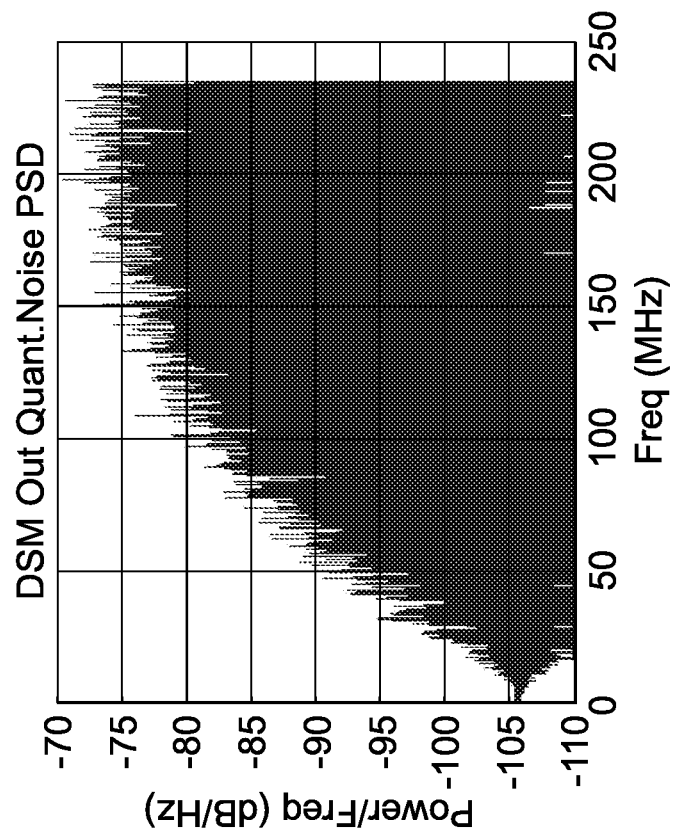
FIG. 12 illustrates a simulation result corresponding quantization noise at the output of the DSM, in accordance with various embodiments of present disclosure.

FIG. 12 illustrates a simulation result corresponding to quantization noise at the output of the DSM 510, in accordance with various embodiments of present disclosure. Shown is the quantization noise power spectral density (PSD) at the output of the DSM 510 as it is being operated at around 500 MHz and the fractional frequency $f_{VCO\_frac}$ is approximately equal to 16 GHz. It was observed that in-band (i.e. within a frequency band of 2.4 MHz) quantization noise PSD was around −40 dB. Whereas, for the DSM 510 being operated at around 4 GHz and the fractional frequency $f_{VCO\_frac}$ approximately equals to 16 GHz, the in-band quantization noise PSD was around −66 dB.

Figure 13:
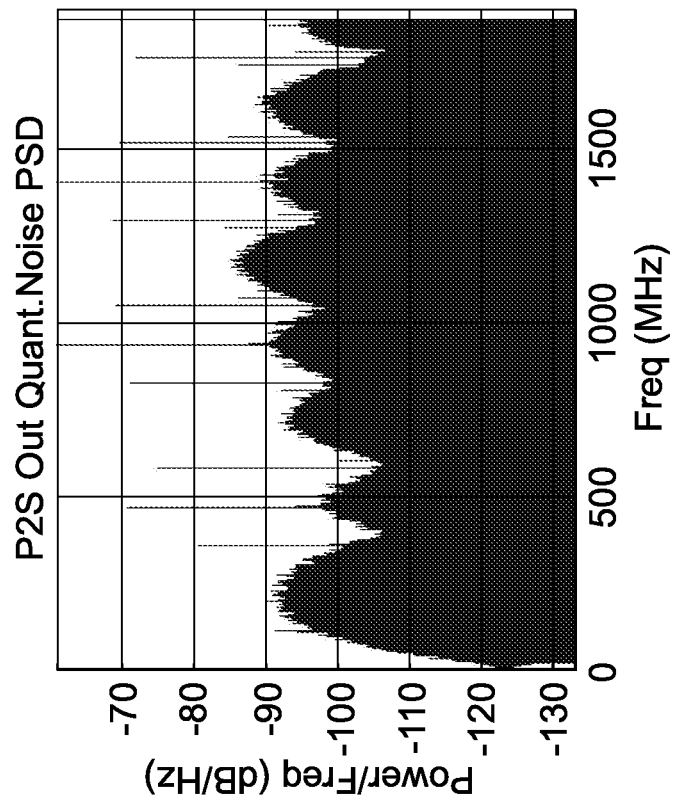
FIG. 13 illustrates a simulation result corresponding quantization noise at the output of the parallel to serial converter, in accordance with various embodiments of present disclosure.

FIG. 13 illustrates a simulation results corresponding quantization noise at the output of the parallel to serial converter 538, in accordance with various embodiments of present disclosure. It was observed that in-band quantization noise PSD was around −54 dB at the output of the parallel to serial converter 538. It is to be appreciated that the PSD associated with the quantization noise has similar noise profile when the DSM 510 operated at around 500 MHz being followed by the parallel to serial converter 538 to generate the control signal 220, as compared to a DSM operating at around 4 GHz. While the DSM 510 followed by the parallel to serial converter 538 consumes less operating power as compared to a DSM operating at around 4 GHz.

Figure 14:
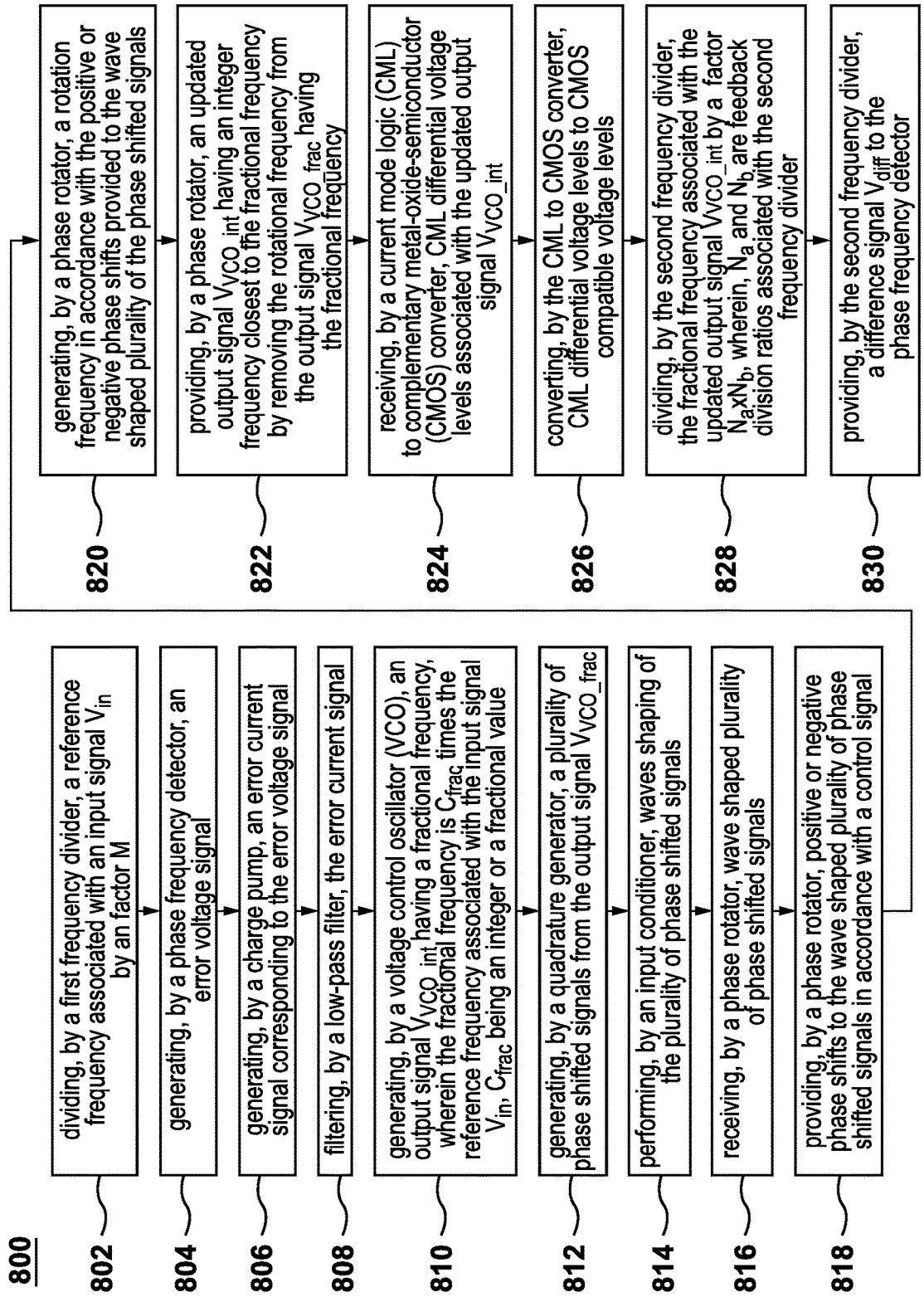
FIG. 14 depicts a flow diagram of a process directed to synthesizing fractional frequency, in accordance with various embodiments of the present disclosure.

FIG. 14 depicts a flow diagram of a process 800 directed to synthesizing fractional frequency, in accordance with various embodiments of the present disclosure. As shown, the process 800 commences at task block 802, where the low jitter PLL based frequency synthesizer 200 divides a reference frequency associated with an input signal $V_{in}$ by an factor M. As noted above, the first frequency divider 202 receives an input signal $V_{in}$ having an associated reference frequency $f_{ref}$. The first frequency divider 202 is configured to divide the frequency $f_{ref}$ associated with the input signal $V_{in}$ by a factor M, where M is any integer value for e.g. 1, 2, 3 etc.

The process 800 proceeds to the task block 804, where the low jitter PLL based frequency synthesizer 200 generates an error voltage signal. As previously discussed, the PFD 204 is configured to compare the frequency $f_{ref}/M$ and its associated phase with the frequency and phase associated with the difference signal $V_{diff}$. In doing so, the PFD 204 generates an error voltage signal, which represents the phase difference between two signals.

The process 800 advances to the task block 806, where the low jitter PLL based frequency synthesizer 200 generates an error current signal corresponding to the error voltage signal. As discussed above, the charge pump 206 and the PFD 204 are configured to operate in conjunction to generate an error current signal based on the error voltage signal as generated by the PFD 204.

The process 800 moves to the task block 808, where the low jitter PLL based frequency synthesizer 200 filters the error current signal. As noted above, the LPF 208 is configured to filter the error current signal generated by the charge pump 206.

The process 800 proceeds to the task block 810, where the low jitter PLL based frequency synthesizer 200 generates an output signal $V_{VCO\_frac}$ having a fractional frequency, wherein the fractional frequency is $C_{frac}$ times the reference frequency associated with the input signal $V_{in}$, Cfrac being an integer or a fractional value. As discussed above, the control signal 218 is provided to the VCO 210. The voltage associated with the control signal 218 may incrementally increase or decrease so as to drive a fractional frequency $f_{VCO\_frac}$ associated with an output signal $V_{VCO\_frac}$ from the VCO 210 in the direction of $C_{frac} \times f_{ref}$, $C_{frac}$ being an integer or a fractional value.

The process 800 advances to the task block 812, where the low jitter PLL based frequency synthesizer 200 generates a plurality of phase shifted signals from the output signal $V_{VCO\_frac}$. As previously discussed, the quadrature generator 302 is configured to receive the output signal $V_{VCO\_frac}$ from the VCO 210 and may generate phase shifted signals from the output signal $V_{VCO\_frac}$.

The process 800 proceeds to the task block 814, where the low jitter PLL based frequency synthesizer 200 performs wave shaping of the plurality of phase shifted signals. As discussed above, the input conditioner 304 is configured to perform wave shaping and convert the shape of the quadrature signals I, Q, I− and Q− to, for example, respective triangular waves.

The process 800 moves to the task block 816, where the phase rotator associated with the low jitter PLL based frequency synthesizer 200 receives wave shaped plurality of phase shifted signals. As noted above, the input conditioner 304 provides the wave shaped quadrature signals I, Q, I− and Q− to the phase rotator 306.

The process 800 proceeds to the task block 818, where the low jitter PLL based frequency synthesizer 200 provides positive or negative phase shifts to the wave shaped plurality of phase shifted signals in accordance with a control signal. As previously discussed, the phase rotator 306 incrementally applies a positive or negative phase shift to the quadrature signals I, Q, I− and Q− in response to a control signal 220 output from the PI controller 216 by rotating to different phase states.

The process 800 advances to the task block 820, where the low jitter PLL based frequency synthesizer 200 generates a rotation frequency in accordance with the positive or negative phase shifts provided to the wave shaped plurality of phase shifted signals. As noted above, the phase rotator 306 is configured to generate a rotation frequency $f_{rot}$ in accordance with the positive or negative phase shift to the quadrature signals I, Q, I− and Q− in response to a control signal 220.

The process 800 moves to the task block 822, where the low jitter PLL based frequency synthesizer 200 provides an updated output signal $V_{VCO\_int}$ having an integer frequency closest to the fractional frequency by removing the rotational frequency from the output signal $V_{VCO\_frac}$ having the fractional frequency. As previously discussed, the rotation of the phase rotator 306 may remove fractional components from fractional frequency $f_{VCO\_frac}$. Thus the output of the phase rotator 306 is an updated output signal $V_{VCO\_int}$ having integer frequency $f_{VCO\_int}$.

The process 800 advances to the task block 824, where the CML to CMOS converter 308 associated the low jitter PLL based frequency synthesizer 200 receives CML differential voltage levels associated with the updated output signal $V_{VCO\_int}$. As discussed above, the CML to CMOS converter 308 is configured to receive the CML differential voltage levels associated with the updated output signal $V_{VCO\_int}$ from the phase rotator 306.

The process 800 proceeds to the task block 826, where the low jitter PLL based frequency synthesizer 200 converts the CML differential voltage levels to CMOS compatible voltage levels. As discussed above, the CML to CMOS converter 308 is configured to convert the CML differential voltage levels associated with the updated output signal $V_{VCO\_int}$ to CMOS compatible voltage levels.

The process 800 moves to the task block 828, where the low jitter PLL based frequency synthesizer 200 divides the integer frequency associated with the updated output signal $V_{VCO\_int}$ by a factor $N_a \times N_b$, wherein, $N_a$ and $N_b$ are feedback division ratios associated with the second frequency divider. As previously discussed, the output of the CML to CMOS converter 308 is feedback to the PFD 204 via the second frequency divider 214. The second frequency divider 214 is configured to divide the integer frequency $f_{VCO\_int}$ associated with the updated output signal $V_{VCO\_int}$ by a factor $N_a \times N_b$ to generate a low frequency difference signal $V_{diff}$ having an associated frequency equals to $f_{VCO\_int}/N_a \times N_b$.

Finally at task block 830, the second frequency divider 214 associated with the low jitter PLL based frequency synthesizer 200 provides a difference signal $V_{diff}$ to the phase frequency detector. As noted above, the second frequency divider 214 provides the difference signal $V_{diff}$ to the PFD 204.

It will be appreciated that at least some of the steps of the process 800 may be performed by computer programs, which may exist in a variety of forms both active and inactive. Such as, the computer programs may exist as software program(s) comprised of program instructions in source code, object code, executable code or other formats. Any of the above may be embodied on a computer readable medium, which include storage devices and signals, in compressed or uncompressed form. Representative non-transitory computer readable storage devices include conventional computer system RAM (random access memory), ROM (read only memory), EPROM (erasable, programmable ROM), EEPROM (electrically erasable, programmable ROM), and magnetic or optical disks or tapes. Representative computer readable signals, whether modulated using a carrier or not, are signals that a computer system hosting or running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general.

Thus, by virtue of techniques provided by the low jitter PLL based frequency synthesizer 200, hardware/software processing speeds are reduced, lower-bandwidth resources may be implemented, power consumption as well as integral non-linearity resulting in jitter is reduced.

It is to be understood that the operations and functionality of the low jitter PLL based frequency synthesizer 200, constituent components, and associated processes may be achieved by one or more of the hardware-based, software-based, firmware-based elements combinations thereof. Such operational alternatives do not, in any way, limit the scope of the present disclosure.

It will also be understood that, although the inventive concepts and principles presented herein have been described with reference to specific features, structures, and embodiments, it is clear that various modifications and combinations may be made without departing from such disclosures. The specification and drawings are, accordingly, to be regarded simply as an illustration of the inventive concepts and principles as defined by the appended claims, and are contemplated to cover any and all modifications, variations, combinations or equivalents that fall within the scope of the present disclosure.

What is claimed is:

1. A phase-lock loop (PLL) based frequency synthesizer, comprising:
   a first frequency divider configured to divide a reference frequency associated with an input signal $V_{in}$ by a factor M;
   a phase frequency detector configured to generate an error voltage signal;
   a charge pump configured to generate an error current signal corresponding to the error voltage signal;
   a low-pass filter configured to filter the error current signal;
   a voltage control oscillator (VCO), communicatively coupled to the low-pass filter, configured to generate an output signal $V_{VCO\_frac}$ having a fractional frequency, wherein the fractional frequency is $C_{frac}$ times the reference frequency associated with the input signal $V_{in}$, $C_{frac}$ being an integer or a fractional value;
   a phase interpolator communicatively coupled in a feedback path between the VCO and the phase frequency detector, wherein the phase interpolator comprises:
     a quadrature generator configured to generate a plurality of phase shifted signals from the output signal $V_{VCO\_frac}$;
     an input conditioner configured to perform wave shaping of the plurality of phase shifted signals;
     a phase rotator, wherein the phase rotator is configured to:
       receive a wave shaped plurality of phase shifted signals;
       provide positive or negative phase shifts to the wave shaped plurality of phase shifted signals in accordance with a control signal;
       generate a rotation frequency in accordance with the positive or negative phase shifts provided to the wave shaped plurality of phase shifted signals;
       provide an updated output signal $V_{VCO\_int}$ having an integer frequency closest to the fractional frequency by removing the rotational frequency from the output signal $V_{VCO\_frac}$ having the fractional frequency;
     a current mode logic (CML) to complementary metal-oxide-semiconductor (CMOS) converter configured to receive CML differential voltage levels associated with the updated output signal $V_{VCO\_int}$ and convert CML differential voltage levels to CMOS compatible voltage levels; and
     a second frequency divider communicatively coupled in the feedback path between the phase interpolator and the phase frequency detector configured to divide the integer frequency associated with the updated output signal $V_{VCO\_int}$ by a factor $N_a \times N_b$, wherein, $N_a$ and $N_b$ are feedback division ratios associated with the second frequency divider and provides a difference signal $V_{diff}$ to the phase frequency detector.

2. The PLL based frequency synthesizer of claim 1, wherein the CIVIL to CMOS converter comprises three AC coupled stages.

3. The PLL based frequency synthesizer of claim 2, wherein the first AC coupled stage further comprises a first capacitor, a second capacitor, a first inverter, a second inverter, a first resistive feedback and a second resistive feedback, wherein the first resistive feedback and the second resistive feedback are adjustable.

4. The PLL based frequency synthesizer of claim 2, wherein the second AC coupled stage is configured to perform correction of the duty cycle associated with the CIVIL differential voltage levels associated with the updated output signal $V_{VCO\_int}$.

5. The PLL based frequency synthesizer of claim 4, wherein the AC coupled stage further comprises a third capacitor, a fourth capacitor, a third inverter, a fourth inverter, a third resistive feedback and a fourth resistive feedback, wherein the third resistive feedback and the fourth resistive feedback are adjustable.

6. The PLL based frequency synthesizer of claim 2, wherein the third AC coupled stage is configured to provide amplitude amplification to the output of the second stage of the CML to CMOS converter.

7. The PLL based frequency synthesizer of claim 1, wherein the quadrature generator is a divider by two based quadrature generator.

8. The PLL based frequency synthesizer of claim 1, wherein the quadrature generator is an all path quadrature generator.

9. The PLL based frequency synthesizer of claim 1, wherein the quadrature generator is a poly-phase filter based quadrature generator.

10. The PLL based frequency synthesizer of claim 1, wherein the quadrature generator is a RC ladder network based quadrature generator.

11. The PLL based frequency synthesizer of claim 1, wherein the quadrature generator is a LC ladder network based quadrature generator.

12. The PLL based frequency synthesizer of claim 1, wherein the input conditioner configured to change the wave shape the plurality of phase shifted signals to triangular waves.

13. The PLL based frequency synthesizer of claim 1, wherein the control signal is generated by a phase interpolator (PI) controller.

14. The PLL based frequency synthesizer of claim 13, wherein the PI controller further comprises:
   a frequency-to-phase converter configured to receive a frequency control word (FCW) and convert a frequency associated with the associated with the FCW to a phase;
   a Delta-Sigma modulator (DSM) configured to generate a step signal in accordance with the FCW;
   a sub-step calculator configured to generate sub-step signals corresponding to the step signal;
   a parallel to serial converter configured to receive sub-step signals in parallel and convert the parallel sub-step signals into a serial signal representing the control signal.

15. The PLL based frequency synthesizer of claim 14, further comprising a third frequency divider.

16. The PLL based frequency synthesizer of claim 15, wherein the third frequency divider is configured to divide the fractional frequency by a first factor $K_1$ and a second factor $K_2$, wherein the second factor $K_2$ is greater than the first factor $K_1$.

17. The PLL based frequency synthesizer of claim 16, the DSM is further configured to operate on a clock frequency equals to the fractional frequency divided by the first factor $K_1$.

18. The PLL based frequency synthesizer of claim 16, the parallel to serial converter is further configured to operate on a clock frequency equals to the fractional frequency divided by the first second factor $K_2$.

19. The PLL based frequency synthesizer of claim 1, wherein the rotation frequency is based on a difference between the fractional frequency and the integer frequency.

20. A method for synthesizing fractional frequency comprising:
   dividing, by a first frequency divider, a reference frequency associated with an input signal $V_{in}$ by a factor M;
   generating, by a phase frequency detector, an error voltage signal;
   generating, by a charge pump, an error current signal corresponding to the error voltage signal;
   filtering, by a low-pass filter, the error current signal;
   generating, by a voltage control oscillator (VCO), an output signal $V_{VCO\_frac}$ having a fractional frequency, wherein the fractional frequency is $C_{frac}$ times the reference frequency associated with the input signal $V_{in}$, $C_{frac}$ being an integer or a fractional value;
   generating, by a quadrature generator, a plurality of phase shifted signals from the output signal $V_{VCO\_frac}$;
   performing, by an input conditioner, wave shaping of the plurality of phase shifted signals;
   receiving, by a phase rotator, wave shaped plurality of phase shifted signals;
   providing, by the phase rotator, positive or negative phase shifts to the wave shaped plurality of phase shifted signals in accordance with a control signal;
   generating, by the phase rotator, a rotation frequency in accordance with the positive or negative phase shifts provided to the wave shaped plurality of phase shifted signals;
   providing, by the phase rotator, an updated output signal $V_{VCO\_int}$ having an integer frequency closest to the fractional frequency by removing the rotational frequency from the output signal $V_{VCO\_frac}$ having the fractional frequency;
   receiving, by a current mode logic (CML) to complementary metal-oxide-semiconductor (CMOS) converter, CIVIL differential voltage levels associated with the updated output signal $V_{VCO\_int}$;
   converting, by the CML to CMOS converter, CML differential voltage levels to CMOS compatible voltage levels;
   dividing, by a second frequency divider, the integer frequency associated with the updated output signal $V_{VCO\_int}$ by a factor $N_a \times N_b$, wherein, $N_a$ and $N_b$ are feedback division ratios associated with the second frequency divider; and
   providing, by the second frequency divider, a difference signal $V_{diff}$ to the phase frequency detector.

* * * * *